(12) United States Patent
Honma

(10) Patent No.: US 9,267,204 B2
(45) Date of Patent: Feb. 23, 2016

(54) FILM DEPOSITION APPARATUS, SUBSTRATE PROCESSING APPARATUS, FILM DEPOSITION METHOD, AND STORAGE MEDIUM

(75) Inventor: Manabu Honma, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 948 days.

(21) Appl. No.: 12/549,446

(22) Filed: Aug. 28, 2009

(65) Prior Publication Data

US 2010/0055316 A1 Mar. 4, 2010

(30) Foreign Application Priority Data

Sep. 4, 2008 (JP) ................................. 2008-227024

(51) Int. Cl.
C23C 16/455 (2006.01)
C23C 16/44 (2006.01)

(52) U.S. Cl.
CPC ........ *C23C 16/45551* (2013.01); *C23C 16/4401* (2013.01); *C23C 16/45519* (2013.01); *C23C 16/45578* (2013.01)

(58) Field of Classification Search
CPC ............ C23C 16/4551; C23C 16/4401; C23C 16/45519; C23C 16/45578
See application file for complete search history.

(56) References Cited

U.S. PATENT DOCUMENTS

| | | | | |
|---|---|---|---|---|
| 4,854,266 A * | 8/1989 | Simson et al. | ................. | 118/728 |
| 5,281,274 A | 1/1994 | Yoder | | |
| 5,338,362 A * | 8/1994 | Imahashi | ..................... | 118/719 |
| 5,620,523 A * | 4/1997 | Maeda et al. | ............ | 118/723 IR |
| 5,744,049 A * | 4/1998 | Hills et al. | ..................... | 216/67 |
| 5,849,088 A | 12/1998 | DeDontney et al. | | |
| 5,906,354 A | 5/1999 | Gilbert et al. | | |
| 6,110,286 A * | 8/2000 | Oh et al. | ..................... | 118/715 |
| 6,232,196 B1 * | 5/2001 | Raaijmakers et al. | ........ | 438/386 |
| 6,279,503 B1 | 8/2001 | Choi et al. | | |
| 6,340,501 B1 | 1/2002 | Kamiyama et al. | | |
| 6,634,314 B2 | 10/2003 | Hwang et al. | | |
| 6,783,738 B1 * | 8/2004 | Sasaki et al. | .................. | 422/173 |
| 6,806,211 B2 * | 10/2004 | Shinriki et al. | ............... | 438/785 |
| 7,128,785 B2 * | 10/2006 | Kaeppeler et al. | .............. | 117/90 |
| 7,153,542 B2 * | 12/2006 | Nguyen et al. | ............ | 427/248.1 |
| 8,034,723 B2 | 10/2011 | Ohizumi et al. | | |
| 8,092,598 B2 | 1/2012 | Baek et al. | | |

(Continued)

FOREIGN PATENT DOCUMENTS

| | | |
|---|---|---|
| CN | 1269046 | 10/2000 |
| CN | 101076878 | 11/2007 |
| JP | 04-287912 | 10/1992 |
| JP | 3144664 | 3/2001 |
| JP | 2001-254181 | 9/2001 |
| JP | 2007-247066 | 9/2007 |
| WO | 2006/065014 | 6/2006 |

* cited by examiner

*Primary Examiner* — Jeffrie R Lund
(74) *Attorney, Agent, or Firm* — IPUSA, PLLC

(57) ABSTRACT

A film deposition apparatus to form a thin film by supplying first and second reaction gases within a vacuum chamber includes a turntable, a protection top plate, first and second reaction gas supply parts extending from a circumferential edge towards a rotation center of the turntable, and a separation gas supply part provided therebetween. First and second spaces respectively include the first and second reaction gas supply parts and have heights H1 and H2. A third space includes the separation gas supply part and has a height H3 lower than H1 and H2. The film deposition apparatus further includes a vacuum chamber protection part which surrounds the turntable and the first, second and third spaces together with the protection top plate to protect the vacuum chamber from corrosion.

15 Claims, 22 Drawing Sheets

(56) References Cited

U.S. PATENT DOCUMENTS

| | | | |
|---|---|---|---|
| 8,372,202 B2 | 2/2013 | Kato et al. | |
| 8,465,591 B2 | 6/2013 | Kato et al. | |
| 8,465,592 B2 | 6/2013 | Kato et al. | |
| 8,518,183 B2 | 8/2013 | Honma | |
| 8,673,079 B2 | 3/2014 | Kato et al. | |
| 8,673,395 B2 | 3/2014 | Kato et al. | |
| 8,721,790 B2 | 5/2014 | Kato et al. | |
| 8,746,170 B2 | 6/2014 | Orito et al. | |
| 8,808,456 B2 | 8/2014 | Kato et al. | |
| 8,835,332 B2 | 9/2014 | Kato et al. | |
| 8,840,727 B2 | 9/2014 | Kato et al. | |
| 8,845,857 B2 | 9/2014 | Ohizumi et al. | |
| 8,853,097 B2* | 10/2014 | Kato | H01L 21/0206 438/758 |
| 8,853,100 B2* | 10/2014 | Igeta | H01L 21/0228 118/715 |
| 8,854,449 B2 | 10/2014 | Aikawa et al. | |
| 8,882,915 B2 | 11/2014 | Kato et al. | |
| 8,882,916 B2 | 11/2014 | Kumagai et al. | |
| 8,906,246 B2 | 12/2014 | Kato et al. | |
| 8,927,440 B2* | 1/2015 | Kato | H01L 21/0228 118/696 |
| 8,932,963 B2* | 1/2015 | Kato | H01L 21/0206 438/758 |
| 8,951,347 B2 | 2/2015 | Kato et al. | |
| 8,961,691 B2 | 2/2015 | Kato et al. | |
| 8,962,495 B2 | 2/2015 | Ikegawa et al. | |
| 8,992,685 B2 | 3/2015 | Kato et al. | |
| 9,023,738 B2 | 5/2015 | Kato et al. | |
| 9,039,837 B2* | 5/2015 | Honma | C23C 16/402 118/719 |
| 9,040,434 B2* | 5/2015 | Kato | H01L 21/02263 118/724 |
| 9,053,909 B2 | 6/2015 | Kato et al. | |
| 9,103,030 B2 | 8/2015 | Kato et al. | |
| 9,111,747 B2* | 8/2015 | Yamawaku | H01L 21/02104 |
| 9,136,133 B2 | 9/2015 | Oshimo et al. | |
| 9,136,156 B2* | 9/2015 | Enomoto | H01L 21/6719 |
| 2002/0195056 A1 | 12/2002 | Sandhu et al. | |
| 2003/0199174 A1* | 10/2003 | Moriyama | 438/758 |
| 2004/0026374 A1* | 2/2004 | Nguyen et al. | 216/89 |
| 2004/0052972 A1 | 3/2004 | Schmitt | |
| 2004/0129215 A1* | 7/2004 | Kaeppeler et al. | 118/715 |
| 2004/0245097 A1* | 12/2004 | Lawson et al. | 204/298.01 |
| 2006/0073276 A1* | 4/2006 | Antonissen | 427/248.1 |
| 2006/0086461 A1* | 4/2006 | Inada et al. | 156/345.33 |
| 2006/0177579 A1* | 8/2006 | Shin et al. | 427/248.1 |
| 2006/0196538 A1 | 9/2006 | Kubista et al. | |
| 2007/0215036 A1* | 9/2007 | Park et al. | 117/88 |
| 2007/0218701 A1 | 9/2007 | Shimizu et al. | |
| 2007/0218702 A1 | 9/2007 | Shimizu et al. | |
| 2008/0208385 A1 | 8/2008 | Sakamoto et al. | |
| 2008/0216864 A1* | 9/2008 | Sexton et al. | 134/1.2 |
| 2009/0272402 A1* | 11/2009 | Kim et al. | 134/1.2 |
| 2009/0324826 A1 | 12/2009 | Kato et al. | |
| 2009/0324828 A1 | 12/2009 | Kato et al. | |
| 2010/0050942 A1 | 3/2010 | Kato et al. | |
| 2010/0050943 A1 | 3/2010 | Kato et al. | |
| 2010/0050944 A1 | 3/2010 | Kato et al. | |
| 2010/0055297 A1 | 3/2010 | Kato et al. | |
| 2010/0055312 A1 | 3/2010 | Kato et al. | |
| 2010/0055314 A1 | 3/2010 | Kato et al. | |
| 2010/0055315 A1 | 3/2010 | Honma | |
| 2010/0055316 A1* | 3/2010 | Honma | C23C 16/4551 427/255.28 |
| 2010/0055319 A1 | 3/2010 | Kato et al. | |
| 2010/0055320 A1 | 3/2010 | Honma | |
| 2010/0055347 A1 | 3/2010 | Kato et al. | |
| 2010/0055351 A1 | 3/2010 | Kato et al. | |
| 2010/0116210 A1 | 5/2010 | Kato et al. | |
| 2010/0124610 A1 | 5/2010 | Aikawa et al. | |
| 2010/0132614 A1 | 6/2010 | Kato et al. | |
| 2010/0132615 A1 | 6/2010 | Kato et al. | |
| 2010/0136795 A1 | 6/2010 | Honma | |
| 2010/0151131 A1 | 6/2010 | Obara et al. | |
| 2010/0227046 A1 | 9/2010 | Kato et al. | |
| 2010/0227059 A1 | 9/2010 | Kato et al. | |
| 2010/0260935 A1 | 10/2010 | Kato et al. | |
| 2010/0260936 A1 | 10/2010 | Kato et al. | |
| 2011/0039026 A1 | 2/2011 | Kato et al. | |
| 2011/0048326 A1 | 3/2011 | Kato et al. | |
| 2011/0100489 A1 | 5/2011 | Drito et al. | |
| 2011/0104395 A1 | 5/2011 | Kumagai et al. | |
| 2011/0126985 A1 | 6/2011 | Ohizumi et al. | |
| 2011/0139074 A1 | 6/2011 | Kato et al. | |
| 2011/0151122 A1 | 6/2011 | Kato et al. | |
| 2011/0155056 A1 | 6/2011 | Kato et al. | |
| 2011/0155057 A1 | 6/2011 | Kato et al. | |
| 2011/0159187 A1 | 6/2011 | Kato et al. | |
| 2011/0159188 A1 | 6/2011 | Kato et al. | |
| 2011/0159702 A1 | 6/2011 | Ohizumi et al. | |
| 2011/0214611 A1 | 9/2011 | Kato et al. | |
| 2011/0236598 A1 | 9/2011 | Kumagai et al. | |
| 2012/0075460 A1 | 3/2012 | Aikawa et al. | |
| 2012/0076937 A1 | 3/2012 | Kato et al. | |
| 2012/0222615 A1 | 9/2012 | Kato et al. | |
| 2012/0267341 A1 | 10/2012 | Kato et al. | |
| 2013/0019801 A1* | 1/2013 | Honma | C23C 16/402 118/719 |
| 2013/0047924 A1* | 2/2013 | Enomoto | H01L 21/67103 118/725 |
| 2013/0059415 A1 | 3/2013 | Kato et al. | |
| 2013/0061804 A1* | 3/2013 | Enomoto | H01L 21/6719 118/719 |
| 2013/0122718 A1 | 5/2013 | Kato et al. | |
| 2013/0164942 A1 | 6/2013 | Kato et al. | |
| 2013/0189849 A1* | 7/2013 | Kato | H01L 21/0206 438/758 |
| 2013/0203268 A1* | 8/2013 | Kato | H01L 21/02263 438/778 |
| 2013/0206067 A1* | 8/2013 | Kato | H01L 21/02104 118/719 |
| 2013/0251904 A1 | 9/2013 | Kato et al. | |
| 2013/0276705 A1* | 10/2013 | Kato | C23C 16/4584 118/725 |
| 2013/0337635 A1* | 12/2013 | Yamawaku | H01L 21/02104 438/466 |
| 2013/0337658 A1 | 12/2013 | Ikegawa et al. | |
| 2014/0004713 A1* | 1/2014 | Igeta | H01L 21/0228 438/775 |
| 2014/0011370 A1* | 1/2014 | Kato | H01L 21/0206 438/782 |
| 2014/0011372 A1* | 1/2014 | Kato | H01L 21/02263 438/787 |
| 2014/0017905 A1* | 1/2014 | Kato | H01L 21/0228 438/782 |
| 2014/0017909 A1* | 1/2014 | Kato | H01L 21/02263 438/787 |
| 2014/0170859 A1* | 6/2014 | Yamawaku | H01L 21/68764 438/778 |
| 2014/0174351 A1 | 6/2014 | Aikawa | |
| 2014/0199856 A1 | 7/2014 | Kato et al. | |
| 2014/0213068 A1 | 7/2014 | Kato et al. | |
| 2014/0220260 A1* | 8/2014 | Yamawaku | C23C 16/45519 427/569 |
| 2014/0345523 A1 | 11/2014 | Kikuchi et al. | |
| 2014/0349032 A1 | 11/2014 | Kato et al. | |
| 2014/0370205 A1* | 12/2014 | Kato | H01L 21/0206 427/569 |
| 2015/0011087 A1 | 1/2015 | Oshimo et al. | |
| 2015/0024143 A1 | 1/2015 | Kumagai et al. | |
| 2015/0078864 A1 | 3/2015 | Sato et al. | |
| 2015/0079807 A1 | 3/2015 | Tamura et al. | |
| 2015/0126044 A1* | 5/2015 | Kato | C23C 16/4584 438/790 |
| 2015/0184293 A1 | 7/2015 | Kato et al. | |
| 2015/0184294 A1 | 7/2015 | Kato et al. | |
| 2015/0214029 A1 | 7/2015 | Hane et al. | |
| 2015/0225849 A1* | 8/2015 | Kato | C23C 16/4584 438/793 |

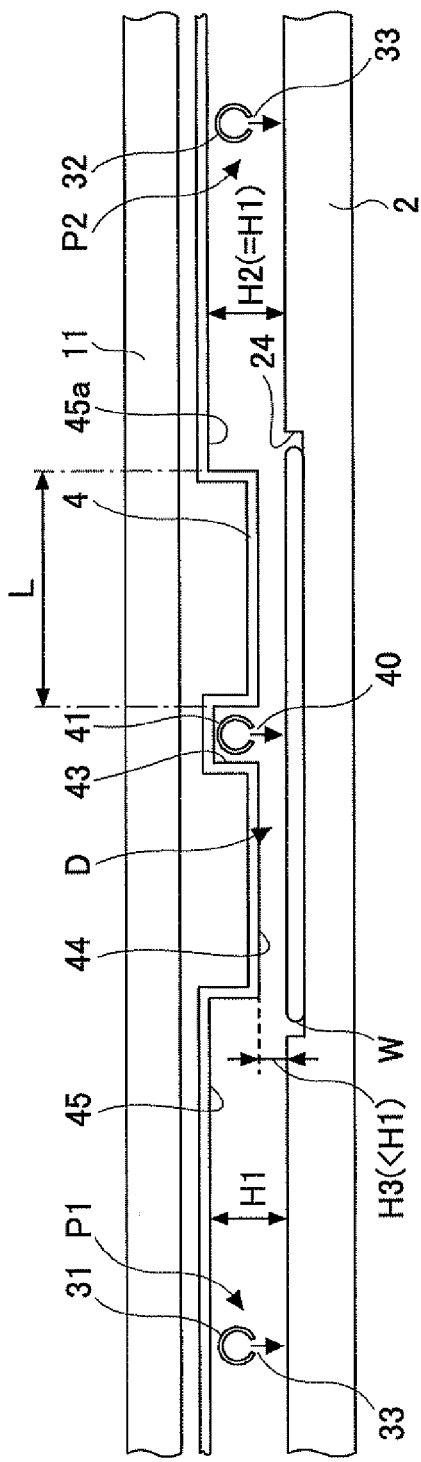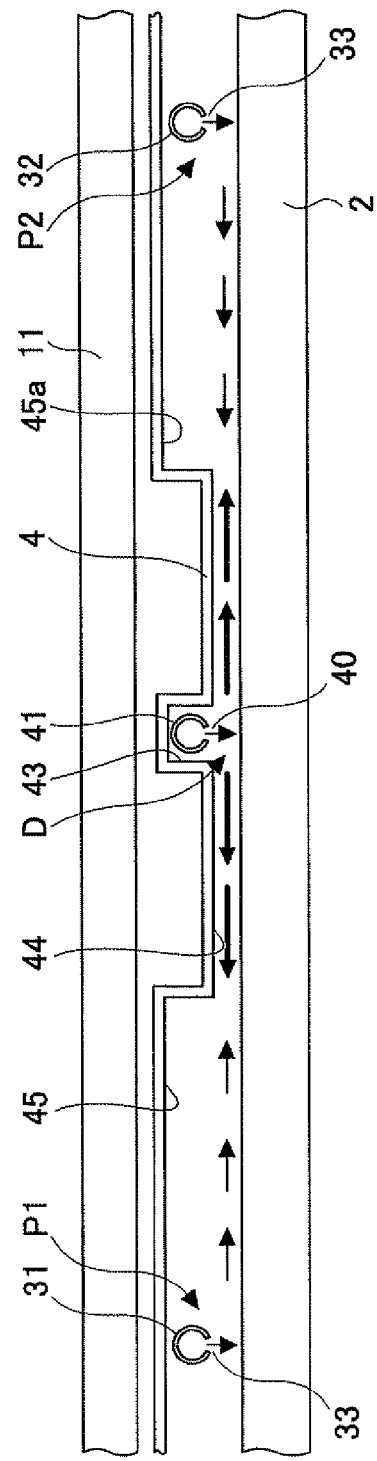

FILM DEPOSITION APPARATUS, SUBSTRATE PROCESSING APPARATUS, FILM DEPOSITION METHOD, AND STORAGE MEDIUM

CROSS-REFERENCE TO RELATED APPLICATIONS

This application is based upon and claims the benefit of priority of the prior Japanese Patent Application No. 2008-227024 filed on Sep. 4, 2008, the entire contents of which are incorporated herein by reference.

BACKGROUND OF THE INVENTION

1. Field of the Invention

The present invention generally relates to film deposition apparatuses, substrate processing apparatuses, film deposition methods and storage media, and more particularly to a film deposition apparatus, a substrate processing apparatus and a film deposition method for forming a thin film by alternately supplying at least two kinds of source gases, and to a computer-readable storage medium which stores a program which, when executed by a computer, causes the computer to execute such a film deposition method.

2. Description of the Related Art

As a film deposition method of a semiconductor fabrication (or manufacturing) process, there is a known process which causes a first reaction gas to adsorb on a surface of a semiconductor wafer (hereinafter simply referred to as a "wafer"), which is used as a substrate, under a vacuum environment, and thereafter switches the gas that is supplied to a second reaction gas, in order to form one or a plurality of atomic or molecular layers using the reaction of the two gases. Such a deposition cycle is performed a plurality of times to stack and deposit the layers on the substrate. This known process is referred to as the Atomic Layer Deposition (ALD) or Molecular Layer Deposition (MLD). According to this known process, the film thickness can be controlled with a high accuracy depending on the number of cycles performed, and a satisfactory in-plane uniformity of the film quality can be achieved. Therefore, this known process is a promising technique that can cope with further reduced film thicknesses of semiconductor devices.

Such a film deposition method may be used to deposit a dielectric film having a high dielectric constant for use as a gate oxide film, for example. When silicon dioxide ($SiO_2$) is deposited as the gate oxide film, a bis(tertiary-butylamino) silane (BTBAS) gas or the like is used as a first reaction gas (source gas) and an ozone gas or the like is used as a second gas (oxidation gas).

In order to carry out such a film deposition method, the use of a single-wafer deposition apparatus having a vacuum chamber and a shower head at a top center portion of the vacuum chamber has been under consideration. In such a film deposition apparatus, the reaction gases are introduced into the chamber from the top center portion, and unreacted gases and by-products are evacuated from a bottom portion of the chamber. When such a deposition chamber is used, it takes a long time for a purge gas to purge the reaction gases, resulting in an extremely long process time because the number of cycles may reach several hundred. Therefore, a film deposition method and a film deposition apparatus that can achieve a high throughput are desired.

Under these circumstances, film deposition apparatuses having a vacuum chamber and a turntable that holds a plurality of wafers along a rotating direction have been proposed.

A U.S. Pat. No. 7,153,542 proposes a film deposition apparatus with a vacuum chamber which has a flat cylinder shape and is divided into right and left areas. Each of the right and left areas has an evacuation port which is formed along a semi-circular contour thereof and is provides upward evacuation. In addition, a separation area formed with a gas inlet port for introducing a separation gas is provided between the right semi-circular contour and the left semi-circular contour, that is, at a diametrical area of the vacuum chamber. Supply areas for mutually different source gases are formed in the right semi-circular area and the left semi-circular area. A work piece passes through the right semi-circular area, the separation area, and the left semi-circular area by rotating a turntable within the vacuum chamber, and the source gases are evacuated via the evacuation port. A ceiling of the separation area to which the separation gas is supplied is lower that that of the supply areas to which the source gases are supplied.

A Japanese Laid-Open Patent Publication No. 2001-254181 proposes a film deposition apparatus in which four wafers are arranged at equal distances on a wafer support member (turntable) along the rotating direction. First and second reaction gas ejection nozzles are arranged at equal distances along the rotating direction in order to oppose the wafer support member. Purge nozzles are arranged between the first and the second gas ejection nozzles. The wafer support member is rotated horizontally. Each wafer is supported by the wafer support member, and an upper surface of the wafer is higher than an upper surface of the wafer support member by an amount corresponding to the thickness of the wafer. The distance between the nozzles and the wafer is 0.1 mm or greater. Vacuum evacuation is made from between the outer edge of the wafer support member and the inner wall of the process chamber. According to this film deposition apparatus, a so-called air curtain is generated below the purge gas nozzles, to thereby prevent the first and second reaction gases from being mixed.

A Japanese Patent No. 3144664 proposes a film deposition apparatus with vacuum chamber that is divided into a plurality of process chambers along the circumferential direction by a plurality of partitions. A circular rotatable susceptor on which a plurality of wafers are placed is provided below the partitions, with a slight gap between the susceptor and the partitions.

A Japanese Laid-Open Patent Publication No. 4-287912 proposes a film deposition method which divides a circular gas supply plate into 8 sections in the circumferential direction, and arranges a $AsH_3$ gas supply port, a $H_2$ gas supply port, a TMG gas supply port and a $H_2$ gas supply port at 90 degree intervals. Further, evacuation ports are provided between the gas supply ports. A susceptor which supports a wafer and opposes the gas supply plate is rotated.

A U.S. Pat. No. 6,634,314 proposes a film deposition apparatus in which an upper area of a turntable is divided into four quarters by four partition walls, and a wafers is placed in each of the four partitioned areas. A source gas injector, a reaction gas injector, and a purge gas injector are alternately arranged in the rotating direction in order to form a cross-shaped injector unit. The injector unit is rotated horizontally so that the injectors sequentially oppose the four partitioned areas, and a vacuum evacuation is made from a periphery of the turntable.

A Japanese Laid-Open Patent Publication No. 2007-247066 proposes a film deposition apparatus for an atomic layer Chemical Vapor Deposition (CVD) that causes a plurality of gases to be alternately adsorbed on a target (corresponding to a wafer). In this apparatus, a susceptor that holds the wafer is rotated, while source gases and purge gases are supplied from above the susceptor. Paragraphs 0023 to 0025 of the Japanese Laid-Open Patent Publication No. 2007-247066 describe partition walls that extend in a radial direction from a center of a chamber, and gas ejection holes that are provided below the partition walls in order to supply the source gases or the purge gas to the susceptor, so that an inert gas is ejected from gas ejection holes to generate a gas curtain. Regarding evacuation of the gases, paragraph 0058 of the Japanese Laid-Open Patent Publication No. 2007-247066 describes that the source and purge gases are evacuated separately through respective evacuation channels 30a and 30b. Techniques similar to that proposed in the Japanese Laid-Open Patent Publication No. 2007-247066 are also proposed in U.S. Patent Application Publications No. US2007/0218701 and No. US2007/0218702.

However, the following problems are encountered when a film deposition process is performed using the film deposition apparatus or the film deposition method proposed in the eight patent documents described above, by arranging a plurality of substrates on the turntable within the vacuum chamber in the rotating direction.

According to the film deposition apparatus and the film deposition method proposed in the U.S. Pat. No. 7,153,542, the upward evacuation port is provided between the separation gas ejection hole and the reaction gas supply area, and the reaction gas is evacuated from the evacuation port together with the separation gas. For this reason, the reaction gas ejected onto the work piece forms an upward flow and is sucked into the evacuation port, to thereby blow particles upwards which may contaminate the wafer.

According to the film deposition apparatus and the film deposition method proposed in the Japanese Laid-Open Patent Publication No. 2001-254181, the air curtain generated from the purge gas nozzles cannot prevent mixture of the reaction gases and may allow the reaction gases on both sides particularly from the upstream side of the rotating direction to flow through the air curtain, because the wafer support member rotates. In addition, the first reaction gas discharged from the first gas outlet nozzle may flow through the center portion of the wafer support member corresponding to the turntable and reach the second reaction gas discharged from the second gas outlet nozzle. If the first reaction gas and the second reaction gas mixed above the wafer, a reaction product is adsorbed on the wafer surface, and it becomes difficult to perform a satisfactory ALD (or MLD) process.

According to the film deposition apparatus and the film deposition method proposed in the Japanese Patent No. 3144664, the process gas may diffuse into the adjacent process chamber from the gap between the partition and the susceptor or the wafer. In addition, because an evacuation chamber is provided between a plurality of process chambers, the gases from the process chambers on the upstream side and the downstream side mix into the evacuation chamber when the wafer passes through the evacuation chamber. Accordingly, the film deposition technique employing the ALD cannot be applied to the proposed film deposition apparatus and the proposed film deposition method.

According to the film deposition apparatus and the film deposition method proposed in the Japanese Laid-Open Patent Publication No. 4-287912, no realistic means is proposed on how to separate the two reaction gases, and the two reaction gases will mix not only in a vicinity of the center of the susceptor but will actually also mix in a region other than the vicinity of the center of the susceptor where the H2 gas supply port is arranged. In addition, when the evacuation port is provided in a surface opposing the region where the wafer passes, the wafer is easily contaminated by the particles that are blown upwards from the susceptor surface.

According to the film deposition apparatus and the film deposition method proposed in the U.S. Pat. No. 6,634,314, after the source gas or the reaction gas is supplied to each partitioned area, it takes a long time to flush the environment of the partitioned area by the purge gas from the purge gas nozzle. Moreover, the source gas or the reaction gas may diffuse from one partitioned area to an adjacent partitioned area by riding over a vertical wall, and the two gases may react in the partitioned area.

According to the film deposition apparatus and the film deposition method proposed in the Japanese Laid-Open Patent Publication No. 2007-247066, the U.S. Patent Application Publication No. US2007/0218701 or the U.S. Patent Application Publication No. US2007/0218702, the source gases may flow into a purge gas compartment from source gas compartments located on both sides of the purge gas compartment and become mixed with each other in the purge gas compartment. As a result, a reaction product is generated in the purge gas compartment, which may cause particles to contaminate the wafer.

Furthermore, according to the film deposition apparatuses and the film deposition methods proposed in the U.S. Pat. No. 7,153,542, the Japanese Laid-Open Patent Publication No. 2001-254181, the Japanese Patent No. 3144664, the Japanese Laid-Open Patent Publication No. 4-287912 and the U.S. Pat. No. 6,634,314, when the film deposition is performed by supplying a corrosive reaction gas including Cl or the like as the first reaction gas or, when a corrosive cleaning gas including Cl or the like is supplied after the film deposition from the nozzle which supplies the first reaction gas, corrosion of portions made of an aluminum material, such as the ceiling of the vacuum chamber, occurs.

SUMMARY OF THE INVENTION

Accordingly, one aspect of the present invention is to provide a film deposition apparatus, a substrate processing apparatus, a film deposition method and a computer-readable storage medium, which can obtain a high throughput, perform a satisfactory process by preventing a plurality of reaction gases from becoming mixed on a substrate, and protect a vacuum chamber from corrosion with respect to the reaction gases or a cleaning gas, when forming a thin film from a plurality of stacked layers of reaction products by sequentially supplying the plurality of reaction gases, which mutually react, to the surface of the substrate.

According to a first aspect of the present invention, there is provided a film deposition apparatus for depositing a thin film on a substrate in a vacuum chamber by sequentially supplying at least two kinds of source gases, including a first reaction gas and a second reaction gas, and by carrying out a supply cycle to sequentially supply said at least two kinds of source gases, said film deposition apparatus comprising a turntable rotatably provided in the chamber and having a substrate receiving part configured to receive a substrate; a protection top plate, disposed above the turntable to oppose the turntable, configured to protect the vacuum chamber from corrosion with respect to the first reaction gas and the second reaction gas; a first reaction gas supply part and a second reaction gas supply part, extending from mutually different positions along a circumferential edge of the turntable towards a rotation center of the turntable, configured to supply the first reaction gas and the second reaction gas, respectively; a first separation gas supply part extending from a position along the circumferential edge of the turntable between the first reaction gas supply part and the second reaction gas supply part towards the rotation center of the turntable, configured to supply a first separation gas for separating the first reaction gas and the second reaction gas from each other; a first lower surface portion located at a first distance from an upper surface of the turntable, and included in a lower surface of the protection top plate which includes the first reaction gas supply part; a first space formed between the first lower surface portion and the turntable; a second lower surface portion located at a second distance from the upper surface of the turntable at a position separated from the first lower surface portion, and included in the lower surface of the protection top plate which includes the second reaction gas supply part; a second space formed between the second lower surface portion and the turntable; a third lower surface portion located at a third distance from the upper surface of the turntable, and included in the lower surface of the protection top plate which includes the first separation gas supply part and is located on both sides of the first separation gas supply part along a rotating direction of the turntable, said third height being lower than each of the first height and the second height; a third space formed between the third lower surface portion and the turntable, and having the third height to flow the first separation gas from the first separation gas supply part to the first space and the second space; a vacuum chamber protection part configured to surround the turntable, the first space, the second space and the third space, together with the protection top plate, and to protect the vacuum chamber from corrosion with respect to the first reaction gas and the second reaction gas; a second separation gas supply part, provided in a central part area included in the lower surface of the protection top plate on a side of the substrate receiving part relative to the rotation center of the turntable, and configured to supply a second separation gas for separating the first reaction gas and the second reaction gas from each other; and an exhaust port configured to exhaust the first reaction gas and the second reaction gas together with the first separation gas ejected to both sides of the third space and the second separation gas ejected from the central part area.

According to a second aspect of the present invention, there is provided a substrate processing apparatus comprising a film deposition apparatus described above; a vacuum transport chamber connected to the film deposition apparatus in an air-tight manner, and having a substrate transport part provided therein; and a load lock chambers connected to the vacuum transport chamber in an air-tight manner, and having an environment therein switched between an atmospheric environment and a vacuum environment.

According to a third aspect of the present invention, there is provided a film deposition method for depositing a thin film on a substrate in a space surrounded by a vacuum chamber protection part which protects a vacuum chamber from corrosion by sequentially supplying at least two kinds of source gases, including a first reaction gas and a second reaction gas, and by carrying out a supply cycle to sequentially supply said at least two kinds of source gases, said film deposition method comprising placing a substrate on a turntable within the vacuum chamber; rotating the turntable; supplying, from a first reaction gas supply part, a first reaction gas to a first space formed between an upper surface of the turntable and a top plate of the vacuum chamber protection part; supplying, from a second reaction gas supply part disposed at a position different from a position of the first reaction gas supply part along a rotating direction of the turntable, a second reaction gas to a second space formed between the upper surface of the turntable and the top plate of the vacuum chamber protection part; supplying, from a first separation gas supply part disposed between the first reaction gas supply part and the second reaction gas supply part, a first separation gas to a third space formed between the upper surface of the turntable and the top plate of the vacuum chamber protection part, said third space being lower than the first space and the second space; supplying a second separation gas for separating the first reaction gas and the second reaction gas to a central part area under the top plate and above the turntable; and moving the substrate with a rotation of the turntable, to repeat supplying the first reaction gas to the surface of the substrate, stop supplying the first reaction gas, supplying the second reaction gas to the surface of the substrate, and stop supplying the second reaction gas, in order to exhaust the first reaction gas and the second reaction gas together with the first separation gas and the second separation gas, to thereby form a thin film on the substrate.

According to a fourth aspect of the present invention, there is provided a computer-readable storage medium which stores a program which, when executed by a computer, causes the computer to perform a film deposition process for depositing a thin film on a substrate in a space surrounded by a vacuum chamber protection part which protects a vacuum chamber from corrosion by sequentially supplying at least two kinds of source gases, including a first reaction gas and a second reaction gas, and by carrying out a supply cycle to sequentially supply said at least two kinds of source gases, said program comprising a procedure causing the computer to rotate a turntable having a substrate placed thereon; a procedure causing the computer to supply, from a first reaction gas supply part, a first reaction gas to a first space formed between an upper surface of the turntable and a top plate of the vacuum chamber protection part; a procedure causing the computer to supply, from a second reaction gas supply part disposed at a position different from a position of the first reaction gas supply part along a rotating direction of the turntable, a second reaction gas to a second space formed between the upper surface of the turntable and the top plate of the vacuum chamber protection part; a procedure causing the computer to supply, from a first separation gas supply part disposed between the first reaction gas supply part and the second reaction gas supply part, a first separation gas to a third space formed between the upper surface of the turntable and the top plate of the vacuum chamber protection part, said third space being lower than the first space and the second space; a procedure causing the computer to supply, a second separation gas for separating the first reaction gas and the second reaction gas to a central part area under the top plate and above the turntable; and a procedure causing the computer to move the substrate with a rotation of the turntable, and repeat supplying the first reaction gas to the surface of the substrate, stop supplying the first reaction gas, supplying the second reaction gas to the surface of the substrate, and stop supplying the second reaction gas, in order to exhaust the first reaction gas and the second reaction gas together with the first separation gas and the second separation gas, to thereby form a thin film on the substrate.

Other objects and further features of the present invention will be apparent from the following detailed description when read in conjunction with the accompanying drawings.

BRIEF DESCRIPTION OF THE DRAWINGS

FIGS. 4A and 4B are cross sectional views, illustrating first through third spaces, for explaining the film deposition apparatus in the first embodiment of the present invention;

DESCRIPTION OF THE PREFERRED EMBODIMENTS

Figure 1:
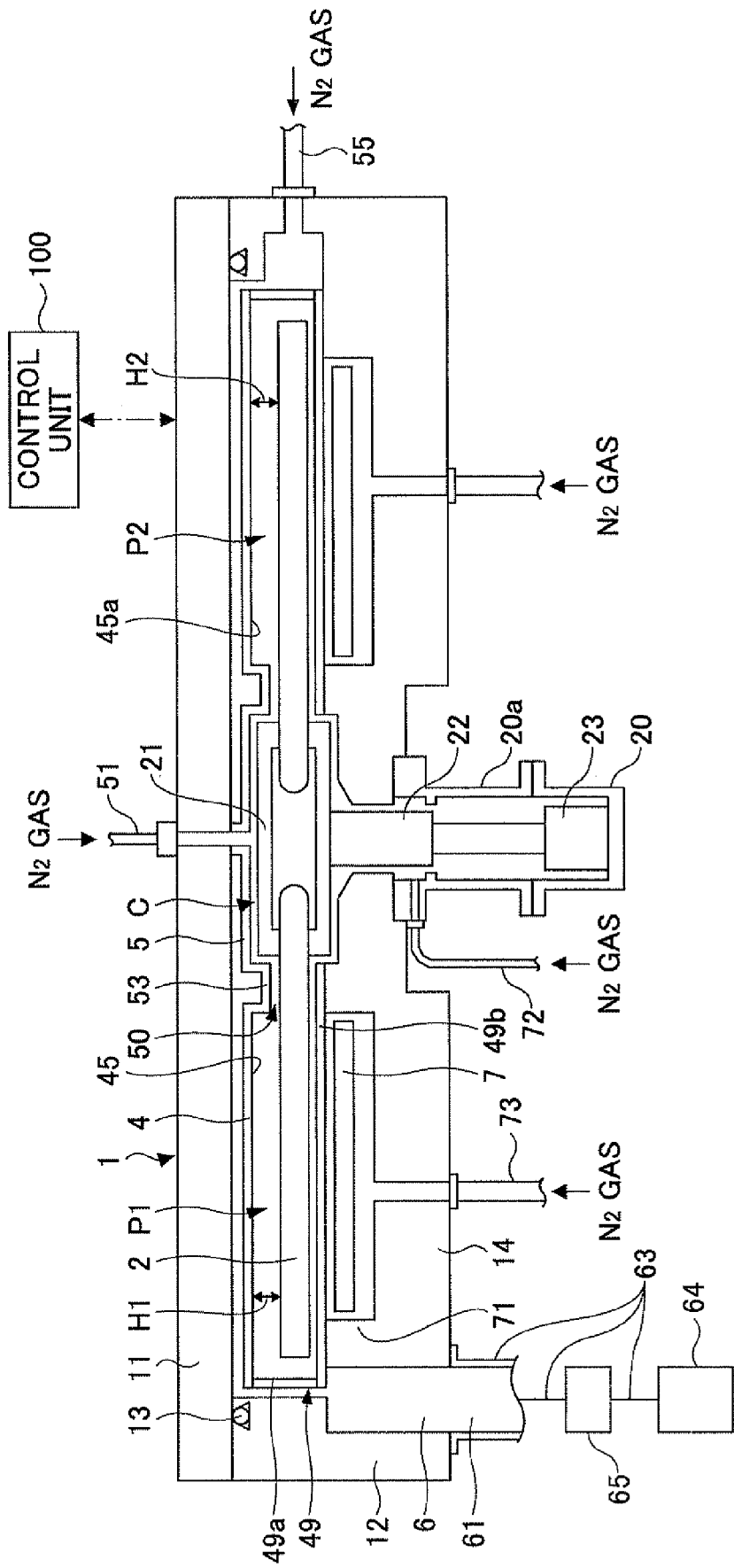
FIG. 1 is a view in vertical cross section schematically illustrating a structure of a film deposition apparatus in a first embodiment of the present invention.

Non-limiting, exemplary embodiments of the present invention will now be described with reference to the accompanying drawings. In the drawings, the same or corresponding reference marks are given to the same or corresponding members or components. It is noted that the drawings are illustrative of the invention, and there is no intention to indicate scale or relative proportions among the members or components, alone or therebetween. Therefore, the specific thickness or size should be determined by a person having ordinary skill in the art in view of the following non-limiting embodiments.

First Embodiment

A description will be given of a film deposition apparatus and a film deposition method in a first embodiment of the present invention, by referring to FIGS. 1 through 10.

Figure 2:
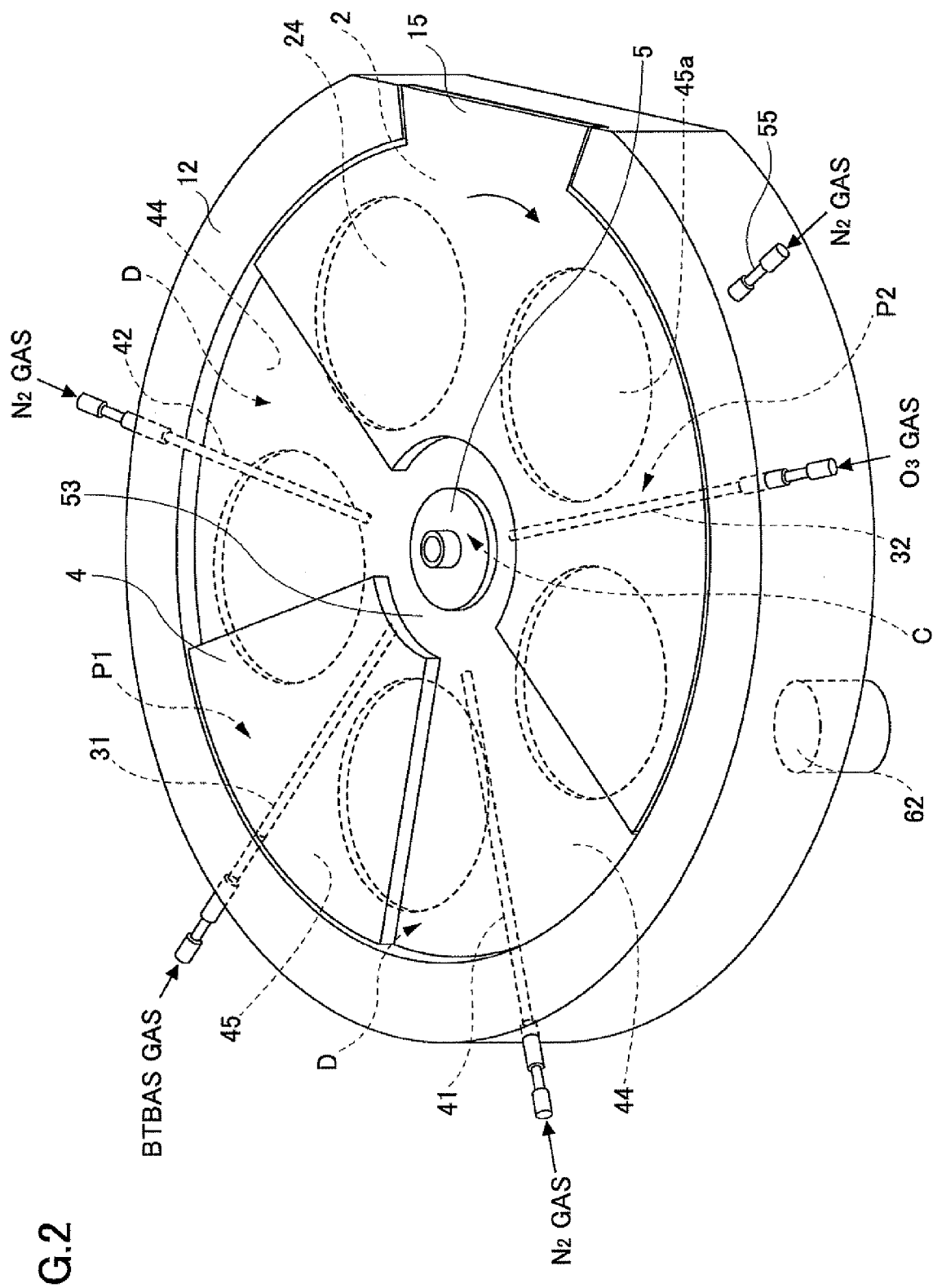
FIG. 2 is a perspective view schematically illustrating the structure of the film deposition apparatus in the first embodiment of the present invention.
Figure 3:
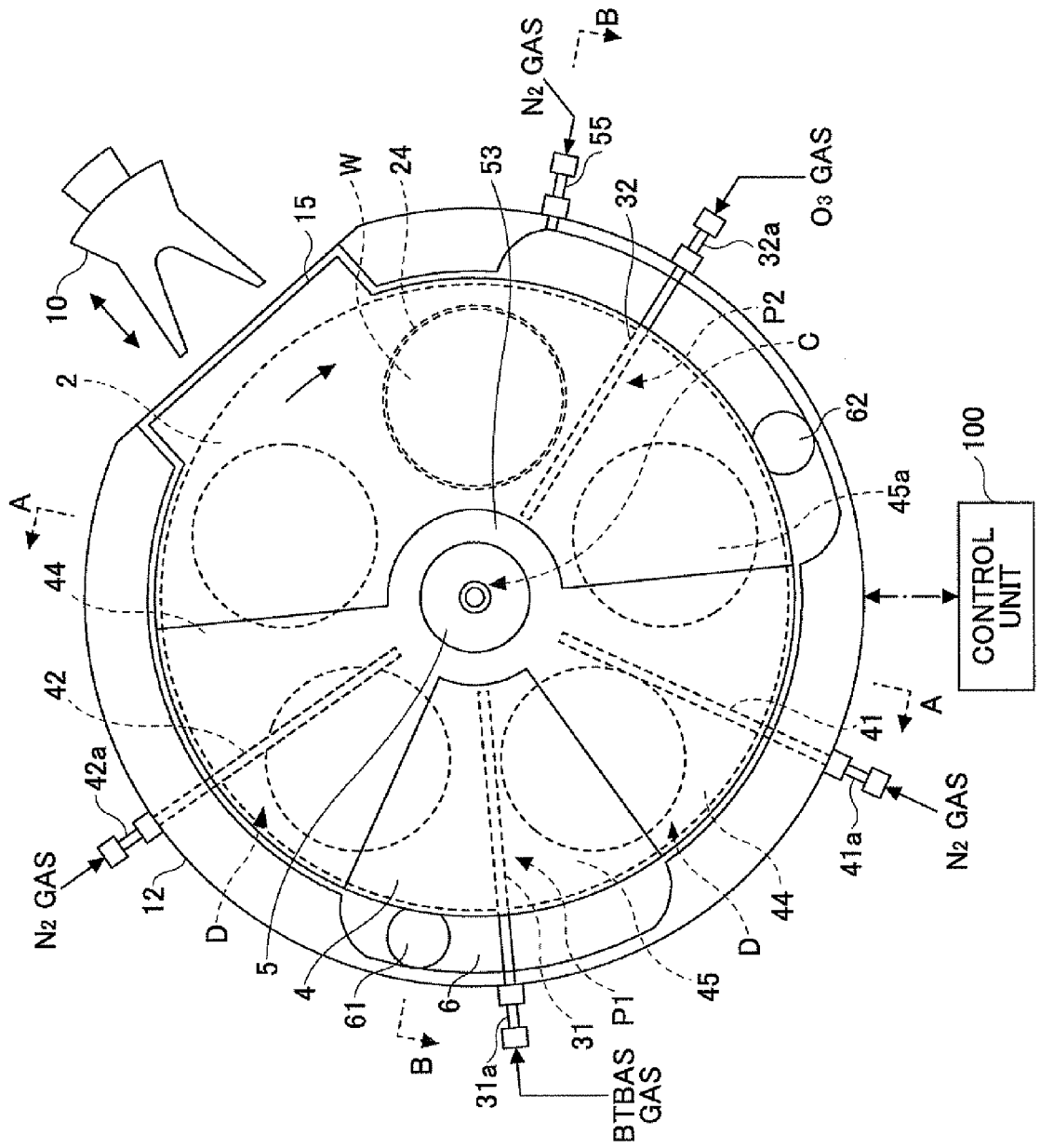
FIG. 3 is a plan view schematically illustrating the structure of the film deposition apparatus in the first embodiment of the present invention.
Figure 5:
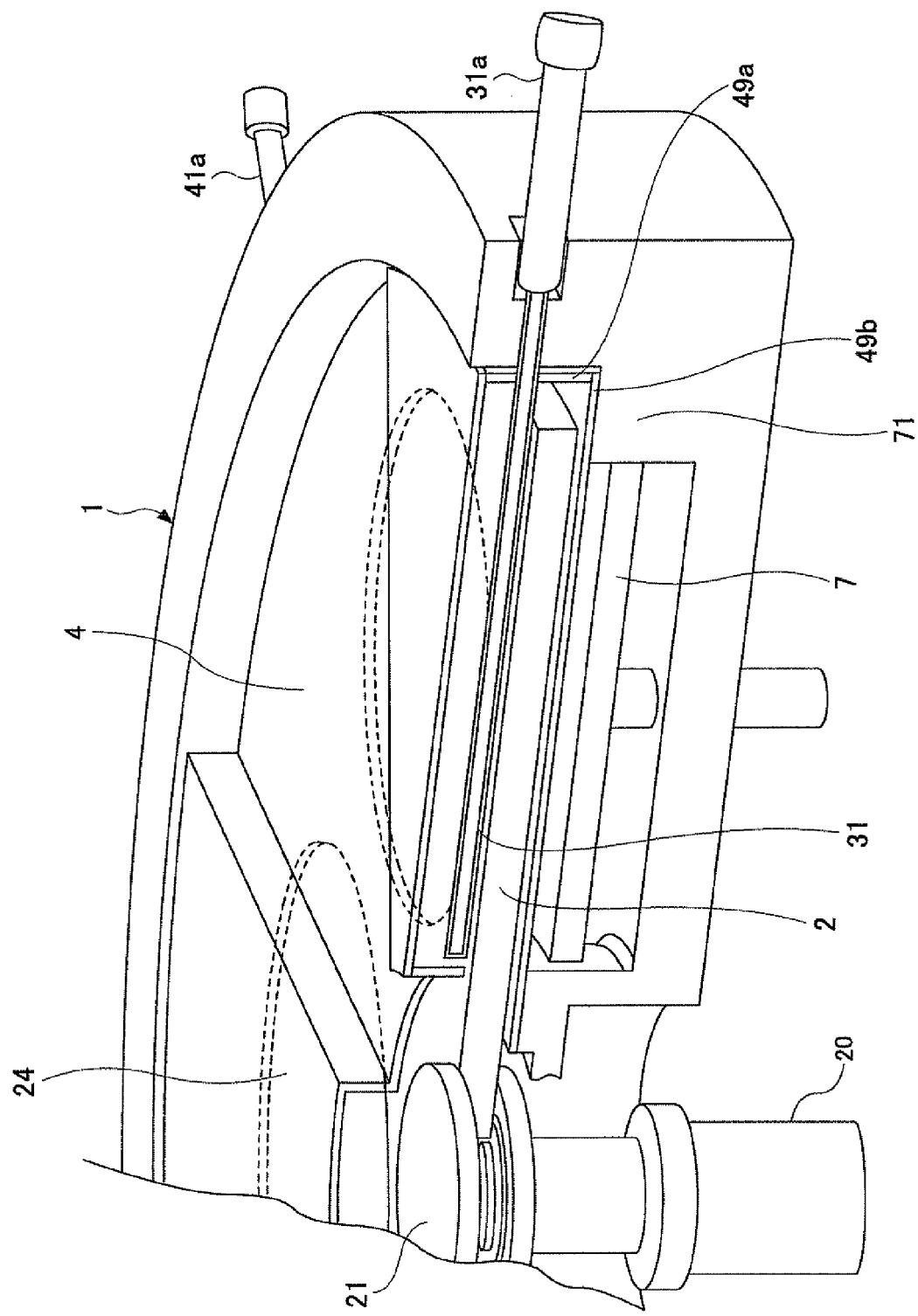
FIG. 5 is a perspective view, illustrating a first reaction gas supply part, for explaining the film deposition apparatus in the first embodiment of the present invention.
Figure 6A:
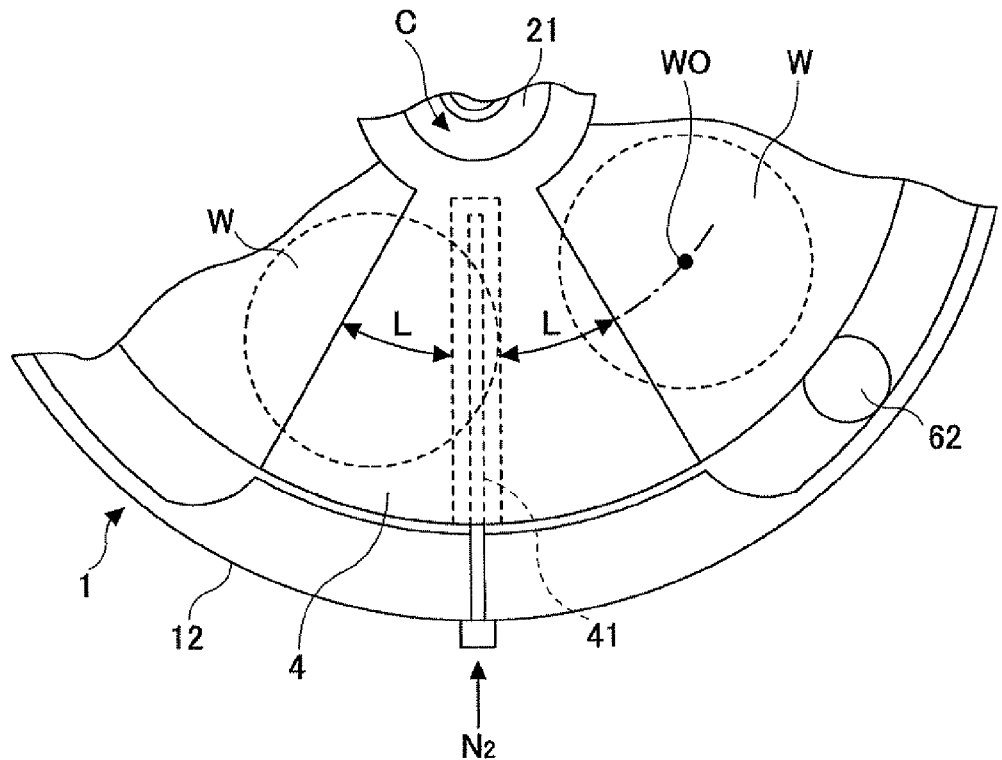
FIGS. 6A and 6B respectively are views in lateral and vertical cross sections, illustrating an example of dimensions of a third lower surface portion, for explaining the film deposition apparatus in the first embodiment of the present invention.
Figure 6B:
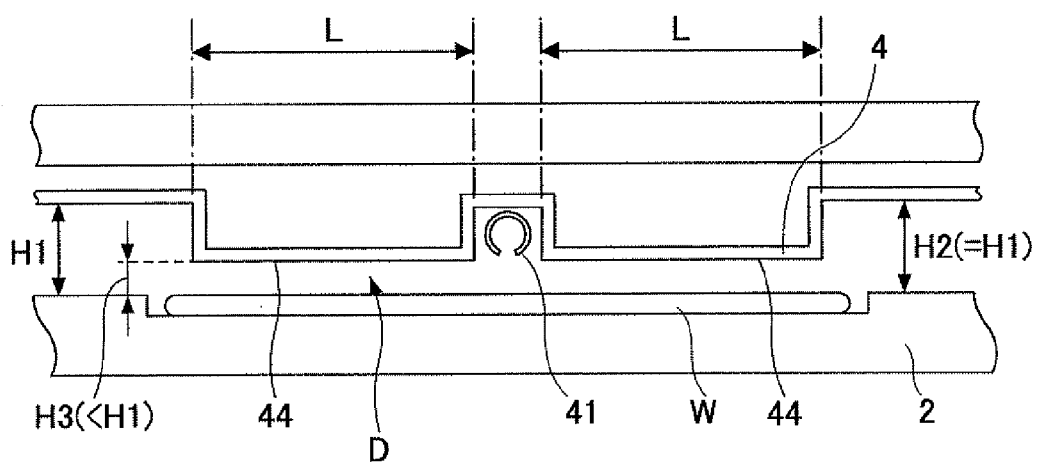
Figure 7:
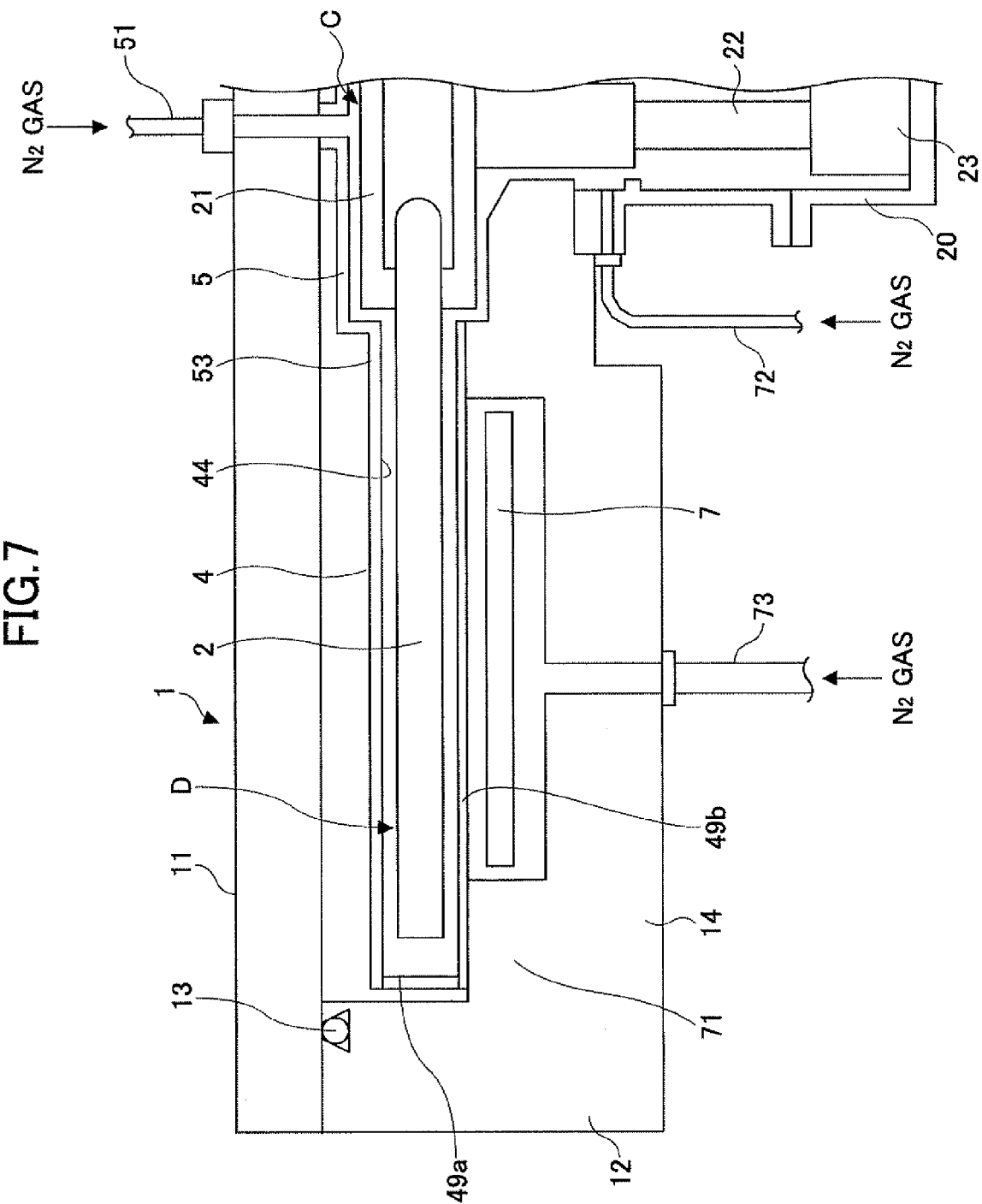
FIG. 7 is a view in vertical cross section along a line A-A in FIG. 3, for explaining a part of the film deposition apparatus in the first embodiment of the present invention.
Figure 8:
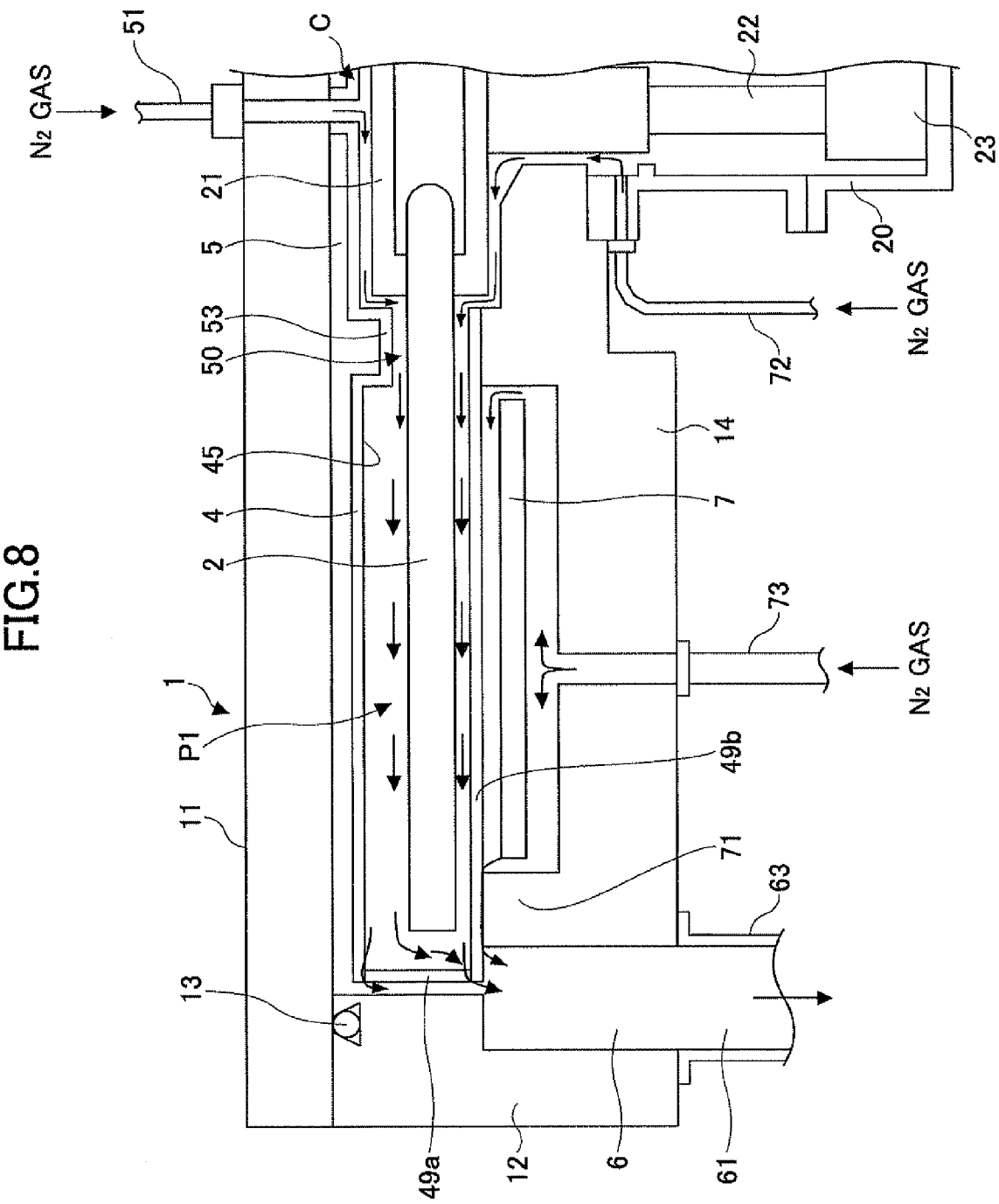
FIG. 8 is a view in vertical cross section along a line B-B in FIG. 3, for explaining a part of the film deposition apparatus in the first embodiment of the present invention in conjunction with flows of a second separation gas, a third separation gas and a second protection gas.
Figure 9:
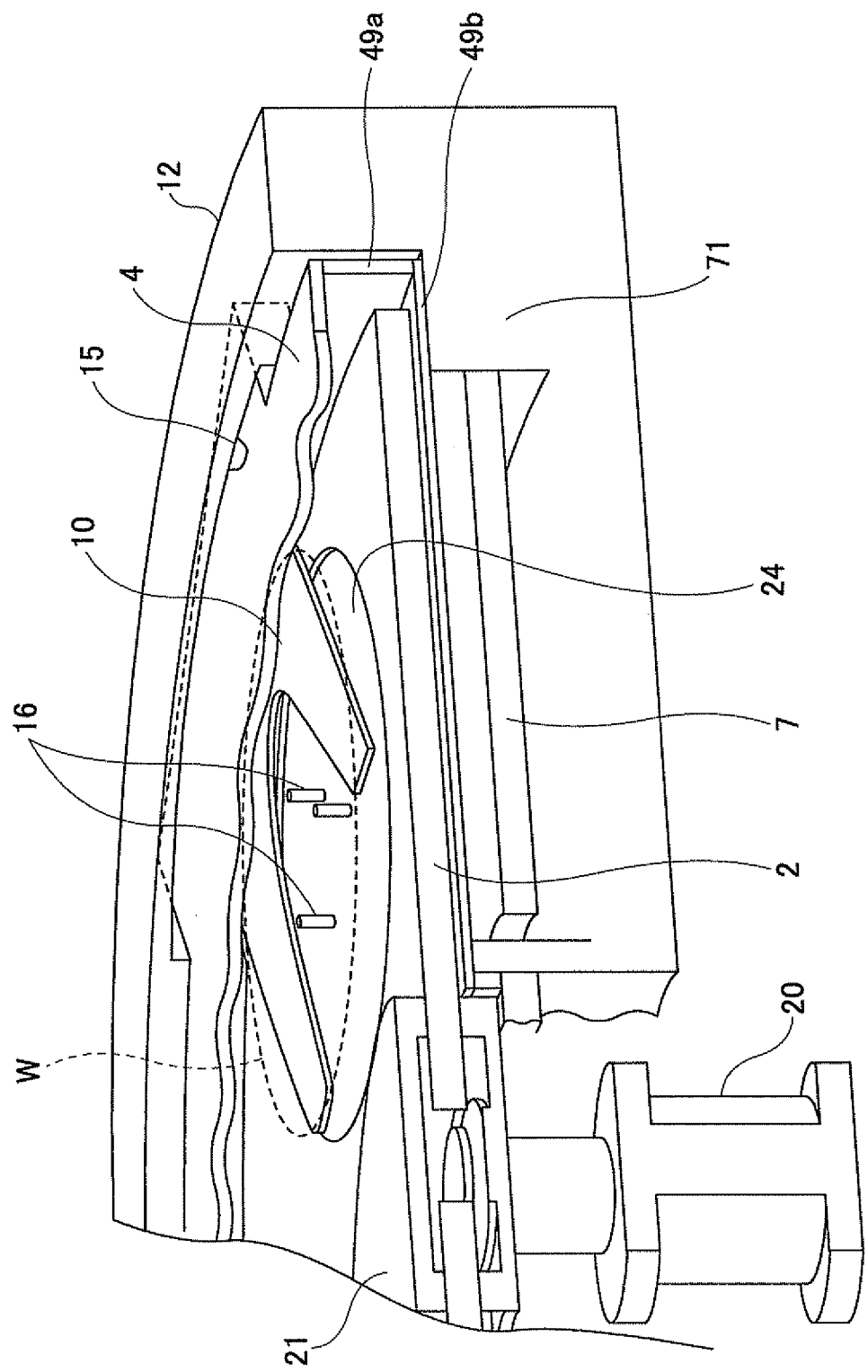
FIG. 9 is a partial perspective view illustrating a part of the film deposition apparatus in the first embodiment of the present invention.
Figure 10:
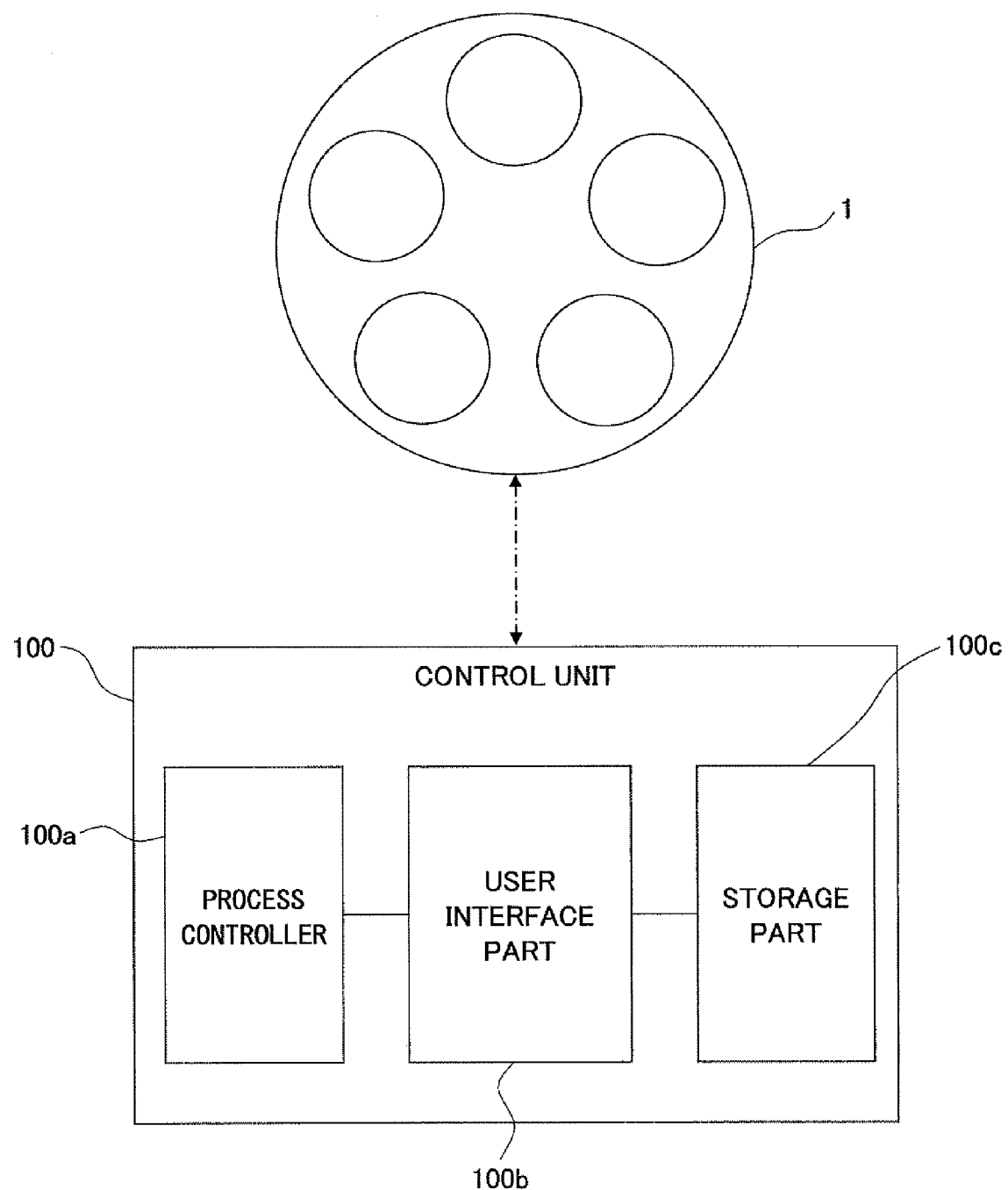
FIG. 10 is a diagram schematically illustrating a structure of a control unit of the film deposition apparatus in the first embodiment of the present invention.

FIG. 1 is a view in vertical cross section schematically illustrating a structure of the film deposition apparatus in this embodiment of the present invention. FIG. 1 illustrates the vertical cross section along a line B-B in FIG. 3. FIG. 2 is a perspective view schematically illustrating the structure of the film deposition apparatus in this embodiment of the present invention. FIG. 3 is a plan view schematically illustrating the structure of the film deposition apparatus in this embodiment of the present invention. FIGS. 2 and 3 respectively are perspective and plan views in a state where a top plate (or ceiling plate) of a vacuum chamber is removed. FIGS. 4A and 4B are cross sectional views, illustrating first through third spaces, for explaining the film deposition apparatus in this embodiment of the present invention. FIGS. 4A and 4B are developments obtained by cutting a turntable and a portion above the turntable along a concentric circle and laterally developing the cut portion. FIG. 5 is a perspective view, illustrating a first reaction gas supply part, for explaining the film deposition apparatus in this embodiment of the present invention. FIGS. 6A and 6B respectively are views in lateral and vertical cross sections, illustrating an example of dimensions of a third lower surface portion, for explaining the film deposition apparatus in this embodiment of the present invention. FIG. 7 is a view in vertical cross section along a line A-A in FIG. 3, for explaining a part of the film deposition apparatus in this embodiment of the present invention. FIG. 8 is a view in vertical cross section along the line B-B in FIG. 3, for explaining a part of the film deposition apparatus in this embodiment of the present invention in conjunction with flows of a second separation gas, a third separation gas and a second protection gas. FIG. 9 is a partial perspective view illustrating a part of the film deposition apparatus in this embodiment of the present invention. FIG. 10 is a diagram schematically illustrating a structure of a control unit of the film deposition apparatus in this embodiment of the present invention.

As illustrated in FIGS. 1 through 3, the film deposition apparatus of this embodiment includes a vacuum chamber 1, a turntable 2 accommodated within the vacuum chamber 1, a first reaction gas supply part 31, a second reaction gas supply part 32, first separation gas supply parts 41 and 42, a protection top plate 4, and a vacuum chamber protection part 49.

As may be seen from FIGS. 1 through 3, the vacuum chamber 1 has a flat cylinder shape which is approximately circular in the plan view. The vacuum chamber 1 includes a top plate (or ceiling plate) 11, a chamber body 12, an O-ring 13, and a bottom surface portion 14.

The top plate 11 is removably (or detachably) provided on the chamber body 12. The top plate 11 is pushed against the chamber body 12 via a suitable sealing member, such as the O-ring 13, due to the decompression state within the vacuum chamber 1, and maintains an air-tight state. When removing the top plate 11 from the chamber body 12, the top plate 11 is lifted upwards by a driving mechanism (not illustrated).

Next, a description will be given of various parts accommodated within the vacuum chamber 1, including the turntable 2, and portions provided under the top plate 11 and above the turntable 2. In other words, a description will be given of the turntable 2, the first reaction gas supply part 31, the second reaction gas supply part 32, the first separation gas supply parts 41 and 42, the protection top plate 4, and a second separation gas supply part 51.

As illustrated in FIG. 1, the turntable 2 has a center of rotation which is arranged at a center of the vacuum chamber 1. The turntable 2 includes a casing body 20, a core part 21, a rotary shaft 22, a driving part 23, and a recess 24.

A center part of the turntable 2 is fixed to the cylindrical core part 21, and the core part 21 is fixed to a top end of a rotary shaft 22 that extends in a vertical direction. The rotary shaft 22 penetrates the bottom surface portion 14 of the chamber body 12, and a lower end of the rotary shaft 22 is fixed to a driving mechanism 23 that rotates the rotary shaft 22 clockwise. The rotary shaft 22 and the driving mechanism 23 are housed in the cylindrical case body 20 which is open at a top thereof. A flange portion 20a of the case body 20 is fixed to the bottom surface of the bottom surface portion 14 of the vacuum chamber 1 in an air-tight manner, in order to maintain an airtight state between an inner environment and an outer environment of the case body 20.

As illustrated in FIGS. 2 and 3, a plurality of recesses 24, each of which receives a wafer W as the substrate, are formed in an upper surface portion of the turntable 2 along the rotating direction (circumferential direction). In this example, the recesses 24 have a circular shape, and five recesses 24 are provided. The recess 24 positions the wafer W, and prevent the wafer W from falling off the turntable 2 due to centrifugal force when the turntable 2 rotates, and forms a susceptor or a substrate receiving part for holding the substrate placed (or set) thereon. For the sake of convenience, the wafer W is only illustrated within one of the recesses 24 in FIG. 3.

As illustrated in FIG. 4A, the recess 24 has a diameter slightly larger than that of the wafer W, and is 4 mm larger than the diameter of the wafer W, for example. The recess 24 has a depth equal to a thickness of the wafer W. Therefore, when the wafer W is placed in the recess 24, the surface of the wafer W is at the same elevation as the surface of the area of the turntable 2 excluding the recesses 24. If there is a relatively large step (or elevation difference) between the surface of the wafer W and the surface of the turntable 2 excluding the recesses 24, a gas flow turbulence (or pressure change) may occur at the stepped portion and affect the in-plane uniformity of the film quality of the wafer W. This is why the surface of the wafer W needs to be at the same elevation as the surface of the area of the turntable 2 excluding the recesses 24. Aligning the surface of the wafer W and the surface of the area of the turntable 2 excluding the recesses 24 to have the same elevation means that, the surface of the wafer W placed in the recess 24 of the turntable 2 and the surface of the area of the turntable 2 excluding the recesses 24 have the same elevation or, the elevation of the surface of the wafer W placed in the recess 24 of the turntable 2 is lower than the surface of the area of the turntable 2 excluding the recesses 24. However, the elevation difference between the surface of the wafer W placed in the recess 24 of the turntable 2 and the surface of the area of the turntable 2 excluding the recesses 24 is desirably as close to zero as possible depending on the processing accuracy or the like, and the elevation difference is desirably 5 mm or less. Three elevation pins penetrate penetration holes in the bottom surface of the recess 24 as will be described later in conjunction with FIG. 9, and the three elevation pins support the back surface of the wafer W and raise or lower the wafer W.

The susceptor or substrate receiving part is not limited to the recesses 24, and for example, a plurality of guide members for guiding circumferential edges of the wafers W may be provided on the surface of the turntable 2 along the circumferential direction or, chuck mechanisms such as electrostatic chucks may be provided on the turntable 2. When the chuck mechanism is provided on the turntable 2 and the wafer W is held on the turntable 2 under suction, the area where the wafer W is placed under suction forms the susceptor or substrate receiving part.

As illustrated in FIGS. 2 and 3, the first reaction gas supply part 31, the second reaction gas supply part 32, and the two first separation gas supply parts 41 and 42 are provided at positions opposing the recesses 24 of the turntable 2 in order to supply the first and second reaction gases, and extend from mutually different peripheral edges of the vacuum chamber 1 (peripheral edges of the turntable 2) towards the center of rotation of the turntable 2. The first reaction gas supply part 31, the second reaction gas supply part 32, and the two first separation gas supply parts 41 and 42 are formed by a nozzle having ejection holes which are arranged at predetermined intervals along a longitudinal direction of the nozzle in order to eject (or discharge) the gases downwards.

The first reaction gas supply part 31, the second reaction gas supply part 32, and the two first separation gas supply parts 41 and 42 are mounted on a sidewall of the vacuum chamber 1, for example, and gas inlet ports 31a, 32a, 41a and 42a at base ends of the gas supply parts 31, 32, 41 and 42 penetrate the sidewall of the vacuum chamber 1. In this embodiment, as illustrated in part in FIG. 5, the gas inlet ports 31a, 32a, 41a and 42a are introduced into the vacuum chamber 1 from the sidewall of the vacuum chamber 1. However, the gas inlet ports 31a, 32a, 41a and 42a may be introduced into the vacuum chamber 1 from a ring-shaped protrusion portion 53 which will be described later. In this case, an L-shaped conduit which opens at the outer circumferential surface of the protrusion portion 53 and at the outer upper surface of the top plate 11 may be provided. The first and second reaction gas supply parts 31 and 32 and the two first separation gas supply parts 41 and 42 may be connected to one opening of the L-shaped conduit inside the vacuum chamber 1, and the gas inlet ports 31a, 32a, 41a and 42a may be connected to the other opening of the L-shaped conduit outside the vacuum chamber 1.

As illustrated in FIGS. 4A and 4B, the first and second reaction gas supply parts 31 and 32 have a plurality of ejection holes 33 to eject the corresponding source gases downwards. The ejection holes 33 are arranged in the longitudinal direction of each of the reaction gas supply parts 31 and 32 at predetermined intervals. For example, the ejection holes 33 have an inner diameter of 0.5 mm, and are arranged at intervals of 10 mm along the longitudinal direction in this embodiment.

On the other hand, as illustrated in FIGS. 4A and 4B, the separation gas supply parts 41 and 42 have a plurality of ejection holes 40 to eject the corresponding separation gases downwards. The ejection holes 40 are arranged in the longitudinal direction of each of the separation gas supply parts 41 and 42 at predetermined intervals. For example, the ejection holes 40 have an inner diameter of 0.5 mm, and are arranged at intervals of 10 mm along the longitudinal direction in this embodiment.

The first and second reaction gas supply parts 31 and 32 are respectively connected to first and second reaction gas supplying sources which are provided outside the vacuum chamber 1. The two first separation gas supply parts 41 and 42 are connected to a first separation gas supplying source which is provided outside the vacuum chamber 1. In the second reaction gas supply part 32, the first separation gas supply part 41, the first reaction gas supply part 31, and the first separation gas supply part 42 are arranged in this sequence along the clockwise direction.

In this embodiment, bis tertiary-butylamino silane (BT-BAS) gas may be used as the first reaction gas, and $O_3$ (ozone) gas may be used as the second reaction gas, for example. In addition, $N_2$ (nitrogen) gas may be used as the first separation gas, for example. Of course, the first separation gas is not limited to $N_2$ gas, and inert gases such as Ar (argon) gas may be used as the first separation gas. Furthermore, the first separation gas is not limited to the inert gases, and $H_2$ (hydrogen) gas or the like may be used as the first separation gas, for example. In other words, any kind of gas may be used as the first separation gas as long as the gas will not introduce undesired effects on the film deposition process.

As illustrated in FIG. 1, the protection to plate 4 is provided between the top plate 11 of the vacuum chamber 1 and the turntable 2 to oppose the turntable 2. The protection top plate 4 protects the vacuum chamber 1 from corrosion with respect to the first and second reaction gases. For example, the protection top plate 4 is made of quartz or ceramics.

As illustrated in FIGS. 2 through 4B, the lower surface of the protection top plate 4 includes a first lower surface portion (or first lower surface area 45 which is a distance H1 from the upper surface of the turntable 2, a second lower surface portion (or second lower surface area) 45a which is a distance H2 from the upper surface of the turntable 2, and a third lower surface portion (or third lower surface area) 44 which is a distance H3 from the upper surface of the turntable 2 and is arranged between the first and second lower surface portions 45 and 45a. The lower surface of the protection top plate 4 also includes, in addition to the three surface portions (or surface areas) 45, 45a and 44, the protrusion portion 53 and rotation center side part 5 in the first lower surface portion 45 and the second lower surface portion 45a. The protrusion portion 53 is adjacent to the rotation center of each area, and the rotation center side part 5 corresponds to the core part 21.

The first lower surface portion 45, the second lower surface portion 45a, and the third lower surface portion 44 are areas of the lower surface of the protection top plate 4, which areas include the first reaction gas supply part 31, the second reaction gas supply part 32, and the first separation gas supply part 41, respectively. The third lower surface portion 44 is bisected by the first separation gas supply part 41.

As illustrated in FIGS. 2 through 4B, a first space P1, a second space P2, and two third spaces D are formed between the turntable 2 and the protection top plate 4 in each of the four areas of the lower surface of the protection top plate 4, where the four areas are the first lower surface portion 45, the second lower surface portion 45a, and the two third lower surface portions 44.

The first lower surface portion 45 of the protection top plate 4 is an area of the lower surface of the protection top plate 4 including the first reaction gas supply part 31, as illustrated in FIGS. 4A and 4B. The second lower surface portion 45a of the protection top plate 4 is an area of the lower surface of the protection top plate 4 including the second reaction gas supply part 32, as illustrated in FIGS. 4A and 4B. The third lower surface portions 44 of the protection top plate 4 are areas of the lower surface of the protection top plate 4 including the first separation gas supply parts 41 and 42, respectively, as illustrated in FIGS. 4A and 4B. Distances from the center axis of each of the first separation gas supply parts 41 and 42 to edges of the third lower surface portions 44 having a fan shape in a forward rotating direction and a reverse rotating direction of the turntable 2 are set equal to each other.

A width of each of the third lower surface portions 44 of the protection top plate 4 may be increased towards the circumferential edge of the turntable 2 on the upstream side of the respective first separation gas supply parts 41 and 42 in the rotating direction of the turntable 2. This is because, a velocity of the gas flow from the upstream side in the rotating direction to the first lower surface portions 44 is higher at portions closer to the circumferential edge of the turntable 2. In this embodiment, a wafer W having a diameter of 300 mm is used as a substrate to be processed. Accordingly, a length of each of the third lower surface portions 44 in a circumferential direction (a length of an arc of a circle concentric to the turntable 2) is, for example, 146 mm at a portion separated from the rotation center by 140 mm and close to the protrusion portion 53, and, for example, 502 mm at an outermost portion of the recess (susceptor or substrate receiving part) 24. As illustrated in FIG. 4A, at the outermost portion, a length L of the third lower surface portion 44 of the protection top plate 4 in the circumferential direction is 246 mm on both sides of the first separation gas supply part 41 (or 42).

The first lower surface portion 45 of the protection top plate 4 including the first reaction gas supply part 31 is positioned at a first height H1 from the turntable 2, as illustrated in FIGS. 1 and 4A. The second lower surface portion 45a of the protection top plate 4 including the second reaction gas supply part 32 is positioned at a second height H2 from the turntable 2, as illustrated in FIGS. 1 and 4A. The third lower surface portions 44 of the protection top plate 4 including the first separation gas supply parts 41 are positioned at a third height H3 from the turntable 2, as illustrated in FIG. 4A. The third height H3 is lower than the first height H1 and the second height H2. A size relationship between the first height H1 and the second height H2 is not limited to a specific relationship, and for example, the first height H1 may be equal to the second height H2 (H1=H2). Accordingly, in this embodiment, the heights H1, H2 and H3 may satisfy a relationship H3<H1=H2.

As illustrated in FIG. 4A, the third lower surface portions 44, which are portions of the lower surface of the protection top plate 4 provided at the height H3 from the turntable 2, exist on both sides in the rotating direction in the first separation gas supply part 41, and the first lower surface portion 45 and the second lower surface portion 45a, which are higher than the third lower surface portions 44, exist on both sides in the rotating direction. In other words, the third space D exists on both sides in the rotating direction in the first separation gas supply part 41, and first space P1 and the second space P2 exist on both sides of the space D3 in the rotating direction. Similarly, the third space D exists between the opposite side of the first space P1 and the opposite side of the second space P2.

Next, a description will be given of a function of separating the environment (or atmosphere) of the first space P1 and the environment of the second space P2 by the third space D.

The third lower surface portion 44 in combination with the first separation gas supply part 41 prevents the first and second reaction gases from entering the third space D and being mixed with each other in the third space D. That is, in the third space D, the second reaction gas is prevented from entering the third space D in a reverse rotating direction of the turntable 2, and the first reaction gas is prevented from entering the third space D in the forwards rotating direction of the turntable 2. The expression "prevented from entering" means that the first separation gas ejected from the first separation gas supply part 41 diffuses into the third space D and flows to the second space P2, which is a space under the adjacent second lower surface portion 45a, and the gases cannot enter from the adjacent first space P1 and the adjacent second space P2. The expression "gases cannot enter" does not only refer to a state where absolutely no gas is allowed to enter the third space D from the adjacent first and second spaces P1 and P2, and also refers to a state where a small amount of gases may enter the third space D but the first reaction gas and the second reaction gas entering the third space D from opposite sides are not mixed with each other in the third space D. As long as one of these states is achieved, the function of separating the environment of the first space P1 and the environment of the second space P2, which function is the role of the third space D, is ensured. Because gases adsorbed on the wafer W can pass through the third space D, the gases in the expression "gases entering" means a gaseous phase of the gases.

As illustrated in FIG. 4A, the height H3 of the third lower surface portions 44 from the turntable 2 may be, for example, approximately 0.5 mm to approximately 10 mm, and preferably approximately 4 mm. In this case, the rotational speed of the turntable 2 is set to, for example, 1 rpm to 500 rpm. In order to ensure the separating function of the third lower surface portions 44, the size of the third lower surface portions 44 and the height H3 of the third lower surface portions 44 from the turntable 2 are set based on experiments depending on the range of the rotational speed of the turntable 2 used and the like. Although an inert gas such as Ar gas, other than $N_2$ gas, may be used as the first separation gas, the first separation gas is not limited to the inert gas, and there is no limitation as to the kind of gas as long as the gas does introduce undesirable effects on the film deposition process.

The third lower surface portions 44 forming the narrow spaces positioned on opposite sides of the first separation gas supply part 41 (or 42) preferably have a width L that is approximately 1/10 to approximately 1/1 the diameter of the wafer W and is preferably greater than or equal to approximately 1/6 the diameter of the wafer W, where the width L is a width of a portion where a center WO of the wafer W passes through and is measured along the rotating direction of the turntable 2, as illustrated for the first separation gas supply part 41 as a representative in FIGS. 6A and 6B. More particularly, in a case where the wafer W has a diameter of 300 mm, the width L is preferably greater than or equal to approximately 50 mm. In order to effectively prevent the reaction gas from entering the third space (or narrow space having the third height lower than the first height H1 and the second height H2) D under the third lower surface portion 44 from opposite sides of the third lower surface portion 44, the third height H3, which is the distance between the third lower surface portion 44 and the turntable 2, needs to be reduced accordingly if the width L is small. Further, if the height H3, which is the distance between the third lower surface portion 44 and the turntable 2, is set to a certain distance, the width L required to obtain the effect of preventing entry of the reaction gases needs to be increased towards positions further away from the rotation center of the turntable 2 because the rotational speed of the turntable 2 increases towards positions further away from the rotation center of the turntable 2. Considering these points of view, if the width L at the portion where the center WO of the wafer W passes is smaller than 50 mm, the height H3, which is a distance between the third lower surface portion 44 and the turntable 2, must be greatly reduced, and thus, a wobble of the turntable 2 needs to be suppressed as much as possible in order to prevent the third lower surface portion 44 from colliding with the turntable 2 or the wafer W when the turntable 2 is rotated. Furthermore, because the reaction gases more easily enter the space under the third lower surface portion 44 from the upstream side of the third lower surface portion 44 as the rotational speed of the turntable increases, the rotational speed of the turntable 2 must be reduced if the width L is set smaller than 50 mm, which is undesirable from the point of view of the throughput. Accordingly, it is desirable to set the width L greater than or equal to 50 mm. However, the size of the third lower surface portion 44 is not limited to the above-mentioned size, and may be adjusted according to process parameters and wafer sizes used. In addition, as is evident from the above description, as long as the third space D, which is the narrow space, has the height at which the flow of the separation gas from the third space D to the first space P1 (or second space P2) is permitted, the height (or third height) H3 of the narrow space (or third space D) may also be adjusted according to the area of the third lower surface portion 44 in addition to the process parameters and wafer sizes used.

As illustrated in FIG. 1, the protrusion portion 53 of the protection top plate 4 is an area opposing the turntable 2 and positioned between the rotation center side and the outer circumferential side of the core part 21 in the first lower surface portion 45 and the second lower surface portion 45a. The protrusion portion 53 of the protection top plate 4 is continuous and integrally formed with the rotation center side of each area, as illustrated in FIG. 7, and the lower surface thereof has the same height as the third lower surface portion 44. However, it is not essential for the protrusion portion 53 of the protection top plate 4 and the third lower surface portions 44 to be integrally formed, and the protrusion portion 53 and the third lower surface portions 44 may be formed as separate parts.

The rotation center side part 5 of the protection top plate 4 is an area located in the rotation center side of the protrusion portion 53. In this embodiment, a boundary between the rotation center side part 5 and the protrusion portion 53 may be provided on a circumference having a radius of 140 mm, for example, from the rotation center.

As illustrated in FIGS. 1 and 7, the second separation gas supply part 51 penetrates the top plate 11 of the vacuum chamber 1 and is connected to the central part of the vacuum chamber 1. The second separation gas supply part 51 supplies the second separation gas to a central part area C, which is a space between the protection top plate 4 and the core part 21. The second separation gas is not limited to a specific gas, and for example, $N_2$ gas may be used for the second separation gas.

The second separation gas supplied to the central part area C flows through a narrow space 50 between the protrusion portion 53 and the turntable 2 and is ejected towards the peripheral edge along the surface of the substrate receiving part side of the turntable 2. Because the space surrounded by the protrusion portion 53 is filled by the second separation gas, the first reaction gas and the second reaction gas are prevented from being mixed with each other through the central part of the turntable 2 between the first space P1 and the second space P2. In other words, the film deposition apparatus is provided with the central part area C which is defined by the central part of the turntable 2 and the vacuum chamber 1 in order to separate the environments of the first space P1 and the atmosphere of the second space P2, and the second separation gas is supplied to the central part area C. In addition, an ejection hole for ejecting the separation gas to the surface of the turntable 2 is formed along the rotating direction in the central part area C. The ejection hole corresponds to the narrow space 50 between the protrusion portion 53 and the turntable 2.

Next, a description will be given of the parts accommodated within the vacuum chamber 1. More particularly, a description will be given of the parts which are located on the circumferential surface side of the turntable 2 and under the turntable 2 and above the bottom surface portion 14. That is, a description will be given of the vacuum chamber protection part 49, the chamber body 12, and an exhaust space 6.

As illustrated in FIGS. 1 and 7, the vacuum chamber protection part 49 is provided under the protection top plate 4, and is arranged to surround the turntable 2, the first space P1, the second space P2, and the third space D together with the protection top plate 4. The vacuum chamber protection part 49 protects the vacuum chamber 1 from corrosion with respect to the first and second reaction gases. The vacuum chamber protection part 49 includes a protection cylinder 49a and a protection bottom plate 49b. The protection cylinder 49a and the protection bottom plate 49b are made of quartz or ceramics, similarly as in the case of the protection top plate 4.

As illustrated in FIGS. 1 and 7, the protection cylinder 39a is provided to oppose the outer end surface of the turntable 2, between the turntable 2 and the chamber body 12. In addition, the protection bottom plate 49b is provided to oppose the lower surface of the turntable 2, between the turntable 2 and the chamber body 12.

Similarly to the protection top plate 4, the protection cylinder 49a and the protection bottom plate 49b prevent the first and second reaction gases from flowing around the outer circumference side of the turntable 2 and mixing with each other. In addition, the protection cylinder 49a and the protection bottom plate 49b are also provided for the purposes of protecting the vacuum chamber 1 from corrosion when the corrosive reaction gas or cleaning gas is supplied from the first and second reaction gas supply parts 31 and 32. However, because the protection top plate 4, the protection cylinder 49a and the protection bottom plate 49b are separable from each other and are removable, a slight space or gap is formed amongst the protection top plate 4, the protection cylinder 49a and the protection bottom plate 49b.

In the third space D, as illustrated in FIG. 7, the inner wall of the chamber body 12 is formed as a vertical surface which is adjacent to and opposes the outer peripheral surface of the protection cylinder 49a. The inner wall of the chamber body 12 is formed as a vertical surface which is adjacent to and opposes the outer peripheral surface of the protection cylinder 49a, a portion other than the third space D as illustrated in FIG. 1, but in the portion other than the third space D, the chamber body 12 has a structure in which a vertical cross sectional shape is cut out in a rectangular shape to penetrate the bottom surface portion 14 from a lower end portion of the inner wall. A resulting cutout portion forms an exhaust space 6 which will be described later.

As illustrated in FIG. 1, a first protection gas supply part 55 is located at a plurality of positions along the rotating direction and opposing the outer peripheral surface of the protection cylinder 49a, on the inner wall of the chamber body 12 of the vacuum chamber 1. The first protection gas supply part 55 supplies a first protection gas between the top plate 11 and the protection top plate 4 of the vacuum chamber 1, in order to protect the vacuum chamber 1 from corrosion. More particularly, the first protection gas is supplied to a space between the top plate 11 and the protection top plate 4 of the vacuum chamber 1, and the top plate 11 of the vacuum chamber 1 is protected from corrosion. In addition, the first protection gas is also supplied to a space between the inner wall of the chamber body 12 of the vacuum chamber 1 and the protection cylinder 49a of the vacuum chamber protection part 49, and the chamber body 12 of the vacuum chamber 1 is protected from corrosion. The first protection gas is not limited to a specific gas, and for example, $N_2$ gas may be used for the first protection gas.

Next, a description will be given of the function of protecting the vacuum chamber 1 by the first protection gas.

The protection top plate 4, the protection cylinder 49a and the protection bottom plate 49b are arranged to surround the turntable 2, the first space P1, the second space P2 and the third space D. Because the protection top plate 4, the protection cylinder 49a and the protection bottom plate 49b are connected in a removable manner, a space or gap is formed amongst the protection top plate 4, the protection cylinder 49a and the protection bottom plate 49b.

By supplying the first protection gas between the protection top plate 4 and the protection cylinder 49a and between the top plate 11 of the vacuum chamber 1 and the chamber body 12 so that the pressure between the protection top plate 4 and the protection cylinder 49a and the pressure between the top plate 11 of the vacuum chamber 1 and the chamber body 12 become higher than the pressure within the space that is surrounded by the protection top plate. 4, the protection cylinder 49a and the protection bottom plate 49b, it is possible to prevent the first reaction gas and the second reaction gas from entering between the protection top plate 4 and the protection cylinder 49a and between the top plate 11 of the vacuum chamber 1 and the chamber body 12. More particularly, by adjusting the amount of the first protection gas supplied from the first protection gas supply part 55 and an amount exhausted from a vacuum exhaust unit (or vacuum exhaust means) which will be described later, the pressure between the protection top plate 4 and the protection cylinder 49a and the pressure between the top plate 11 of the vacuum chamber 1 and the chamber body 12 can be made 100 Pa higher, for example, than the pressure within the space that is surrounded by the protection top plate 4, the protection cylinder 49a and the protection bottom plate 49b.

When the film deposition is made by using a reaction gas that includes chlorine gas as the first or second reaction gas or, when the turntable 2 is cleaned by supplying a cleaning gas that includes chlorine from the first reaction gas supply part 31 or the second reaction gas supply part 32 in place of the first or second reaction gas, the top plate 11 of the vacuum chamber 1 and the chamber body 12 can be protected from corrosion with respect to the first and second reaction gases by supplying the first protection gas.

A bottom part of the exhaust space 6 is provided with, for example, two exhaust ports 61 and 62 as illustrated in FIGS. 1 and 3. The exhaust ports 61 and 62 are connected to a common vacuum pump 64, which is an example of a vacuum exhaust means, through an exhaust pipe 63. A pressure adjuster 65, which is an example of a pressure adjusting means, is provided between the exhaust port 61 and the vacuum pump 64 with respect to the exhaust pipe 63. The pressure adjuster 65 may be provided with respect to each of the exhaust ports 61 and 62 or, may be used in common for the exhaust ports 61 and 62. The exhaust ports 61 and 62 are provided on both sides of the third space D in the rotating direction in the plan view in order to exclusively exhaust the first reaction gas and the second reaction gas, so that the function of separating the third space D is positively performed. In this embodiment, the exhaust port 61 is provided between the first reaction gas supply part 31 and the third space D which is adjacent to the first reaction gas supply part 31 on the downstream side in the rotating direction. On the other hand, the second exhaust port 62 is provided between the second reaction gas supply part 32 and the third space D which is adjacent to the second reaction gas supply part 32 on the downstream side in the rotating direction.

The number of the exhaust ports is not limited to two, and three exhaust ports may be provided by providing an additional exhaust port between the third space D including the first separation gas supply part 42 and the second reaction gas supply part 32 which is adjacent to the third space D on the downstream side in the rotating direction. Further, four or more exhaust ports may be provided. The exhaust ports 61 and 62 are provided at positions lower than the turntable 2 in the bottom surface portion 14 of the vacuum chamber 1 in this embodiment in order to exhaust the gases through the space between the inner wall of the vacuum chamber 1 and the protection cylinder 49a, the space between the protection top plate 4 and the protection cylinder 49a, and the space between the protection cylinder 49a and the protection bottom plate 49b. However, the exhaust ports 61 and 62 are not limited to be provided in the bottom surface portion 14 of the vacuum chamber 1, and may be provided on the sidewall of the vacuum chamber 1. If the exhaust ports 61 and 62 are provided on the sidewall of the vacuum chamber 1, the exhaust ports 61 and 62 may be provided at positions higher than the turntable 2. Because the gases on the turntable 2 flow towards the outer side of the turntable 2 by providing the exhaust ports 61 and 62 as mentioned above, there is an advantage from a viewpoint that particles are suppressed from being blown upwards as compared to a case where the exhaust is made through a ceiling surface facing the turntable 2.

Next, a description will be given of the parts accommodated within the vacuum chamber 1, and more particularly to the parts under the vacuum chamber protection part 49 and up to the bottom surface portion 14 of the vacuum chamber 1. Specifically, a description will be given of a heater unit 7 (heating part), a cover member 71, the bottom surface portion 14, a third separation gas supply part 72, and a second protection gas supply part 73.

As illustrated in FIG. 1 and FIG. 5, the heater unit 7 is provided between the turntable 2 and the bottom surface portion 14 of the vacuum chamber 1. The heater unit 7 heats the wafer W on the turntable 2, via the turntable 2, to a temperature that is determined by a process recipe. Instead of providing the heater unit 7 under the turntable 2, the heater unit 7 may be provided above the turntable 2 or, may be provided both above and under the turntable 2. Moreover, the heater unit 7 is not limited to a heater unit that uses a resistance heating element, and may be formed by a heater unit that uses an infrared lamp. A lower half portion of the heater unit 7 may be provided with a reflector (or reflection plate) which reflects heat radiated downwards from the heater unit 7 upwards.

The cover member 71 is provided on the circumferential edge side of the turntable 2 and under the turntable 2 to partition the space under the turntable 2 and the exhaust space 6, and to place thereon the protection bottom plate 49b of the vacuum chamber protection part 49. In addition, the cover member 71 is formed to surround the entire heater unit 71. The cover member 71 contacts the protection bottom plate 49b, and prevents the first reaction gas and the second reaction gas from entering an inner circumference side of the cover member 71.

The bottom surface portion 14 is adjacent to the central part of the lower surface of the turntable 2 and the core part 21 with a narrow space or gap in a portion closer to the rotation center than the space where the heater unit 7 is arranged. In a penetration hole penetrating the bottom surface portion 14 to accommodate the rotary shaft 22, a space or gap between the inner surface defining the penetration hole and the rotary shaft 22 is narrow. The penetration hole is connected to the casing body 20.

The third separation gas supply part 72 is provided on the casing body 20. The third separation gas supply part 72 is provided to supply a third separation gas to the narrow space. The third separation gas is not limited to a specific gas, and for example, $N_2$ gas may be used for the third separation gas.

The second protection gas supply part 73 is provided at a plurality of positions along the rotating direction under the heater unit 7 in the bottom surface portion 14 of the vacuum chamber 1. The second protection gas supply part 73 supplies a second protection gas to the space where the heater unit 7 is arranged. The second protection gas is not limited to a specific gas, and for example, $N_2$ gas may be used for the second protection gas.

In FIG. 8, flow paths of the third separation gas and the second protection gas are indicated by arrows. For example, $N_2$ gas is supplied to a space extending from inside the chamber body 12 to the space where the heater unit 7 is arranged, by providing the third separation gas supply part 72 and the second protection gas supply part 73, so that the $N_2$ gas is exhausted to the exhaust ports 61 and 62 through the exhaust space 6 from the space between turntable 2 and the cover member 71. Hence, the first reaction gas and the second reaction gas are prevented from flowing from one of the first space P1 and the second space P2 to the other of the first space P1 and the second space P2 by flowing under the turntable 2, and thus, the third separation gas functions as a separation gas. Moreover, because the first reaction gas and the second reaction gas are prevented from entering the space, under the protection bottom plate 49b, where the heater unit 7 is arranged, from the first space P1 and the second space P2, the second protection gas can prevent the first reaction gas and the second reaction gas from being adsorbed onto the heater unit 7.

Next, a description will be given of a part provided outside the vacuum chamber 1, and a part for performing a transport between the part provided outside the vacuum chamber 1.

As illustrated in FIGS. 2, 3 and 9, a transport port 15 for transferring the wafer W between an external transport arm 10 and the turntable 2 is formed in the side wall of the vacuum chamber 1. The transport port 15 is opened and closed by a gate valve which is not illustrated in the figures. Because the transfer of the wafer W is performed between the transport arm 10 at the position of the transport port 15 in the recess 24 which forms the substrate receiving part on the turntable 2, a lifting mechanism for lifting elevation pins 16 is provided at a position corresponding to a transfer position under the turntable 2. The elevation pins 16 penetrate the recess 24 to lift the wafer W from the backside of the wafer W.

The film deposition apparatus according to this embodiment is provided with the control unit 100 including a computer, such as a Micro Controller Unit (MCU), for controlling an operation of the entire film deposition apparatus, as illustrated in FIGS. 1 and 3. As illustrated in FIG. 10, the control unit 100 includes a process controller 100a including a Central Processing Unit (CPU), a Micro Processing Unit (MPU) or the like to control each part of the film deposition apparatus, a user interface part 100b, and a storage part 100c.

The user interface part 100b includes a keyboard for performing a command input operation to manage the film deposition apparatus by a process manager (or process managing person), and a display for visualizing and displaying an operating state of the film deposition apparatus.

The storage part 100c stores a control program (or software) for achieving various processes performed by the film deposition apparatus by a control of the process controller 110a, and a recipe that stores process condition data or the like. A desired process is performed by the film deposition apparatus by retrieving an arbitrary recipe from the storage part 100c according to an instruction from the user interface part 100b and causing the process controller 100a to execute the recipe, in order to cause the film deposition apparatus to execute desired functions under the control of the process controller 100a. In other words, the control program controls the film deposition apparatus to cause the computer to achieve functions related to the film deposition process of the film deposition apparatus, to cause the computer to execute procedures related to the film deposition process of the film deposition apparatus or, to cause the computer to function as units or means for executing the film deposition process of the film deposition apparatus. The control program and the recipe of process condition data may be stored in a computer-readable storage medium (for example, a hard disk, a compact disc, a magneto-optical disk, a memory card, a floppy disk (registered trademark), and the like) which is not illustrated. The control program and the recipe of the process condition data stored in such a computer-readable storage medium may be installed into the storage part 100c and used. Alternatively, the control program and recipe of the process condition data may be transferred from other apparatuses through an exclusive line to achieve an online use, if necessary.

Figure 11:
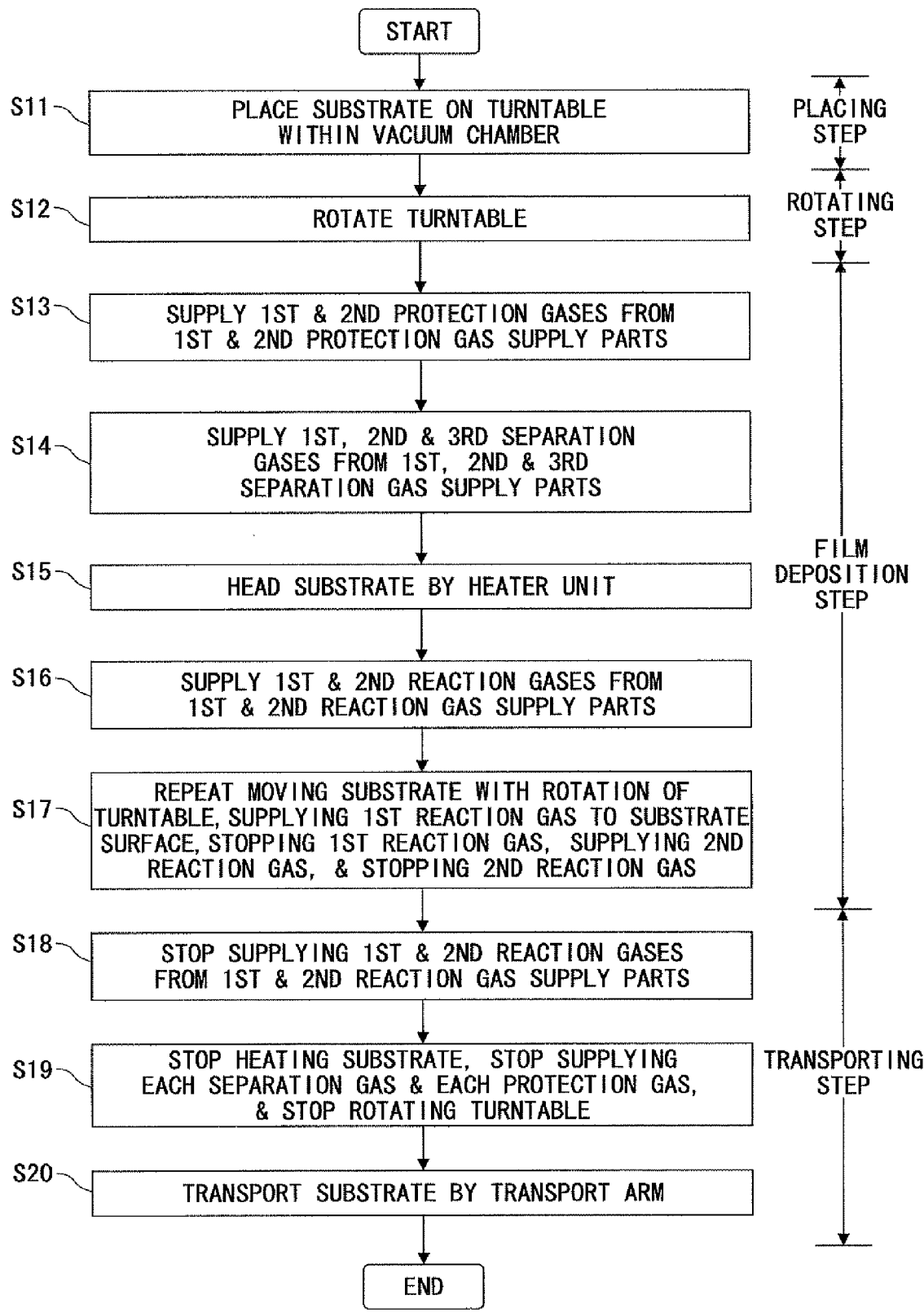
FIG. 11 is a diagram for explaining procedures of a film deposition method using the film deposition apparatus in the first embodiment of the present invention.
Figure 12:
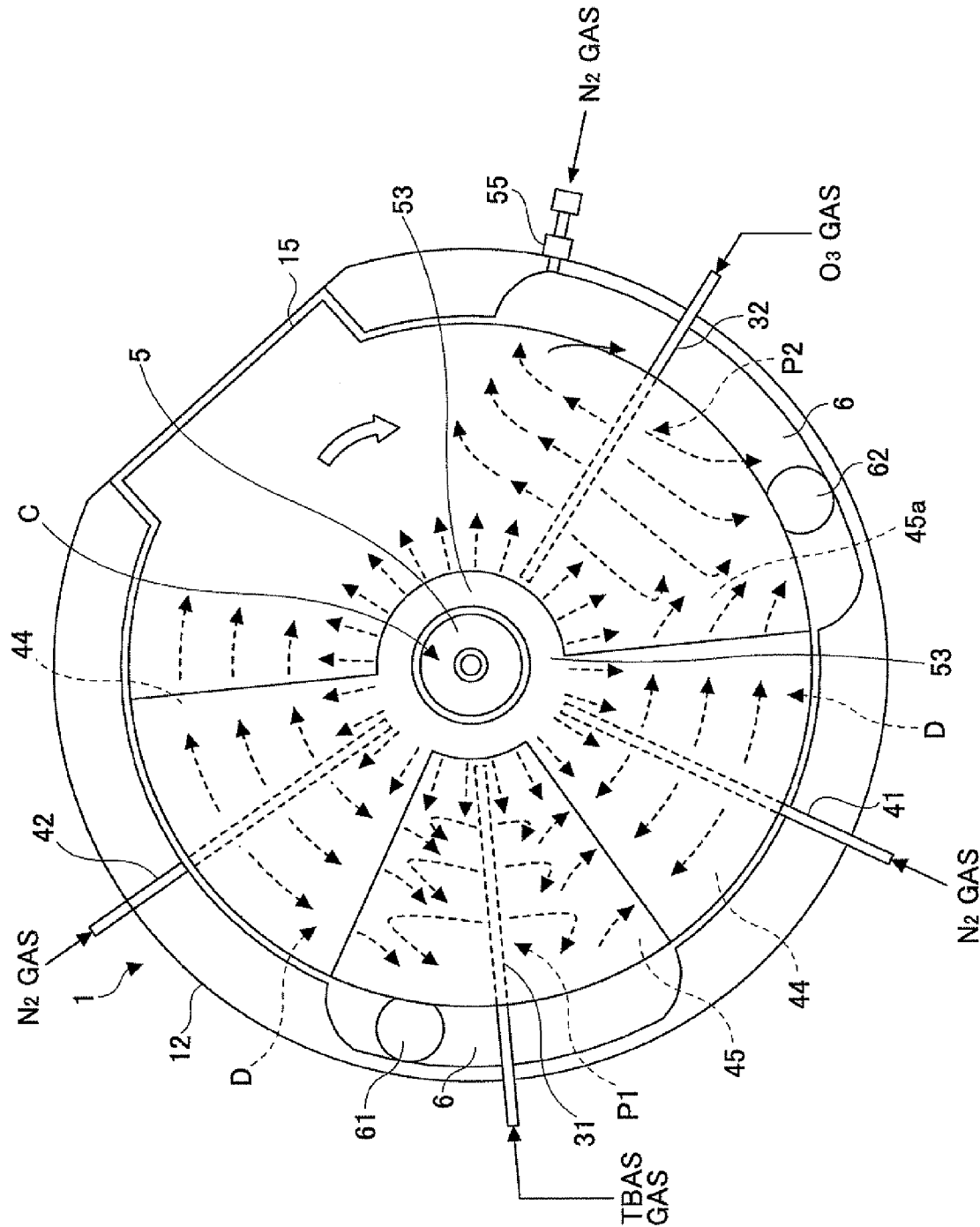
FIG. 12 is a diagram for explaining the film deposition method using the film deposition apparatus in the first embodiment of the present invention in conjunction with flows of a first reaction gas, a second reaction gas and a first separation gas.

FIG. 11 is a diagram for explaining procedures of the film deposition method using the film deposition apparatus in this embodiment of the present invention. In addition, FIG. 12 is a diagram for explaining the film deposition method using the film deposition apparatus in this first embodiment of the present invention in conjunction with flows of the first reaction gas, the second reaction gas and the first separation gas. Similarly to FIG. 3, FIG. 12 illustrates a plan view in a state where the top plate 11 of the vacuum chamber 1 is removed.

As illustrated in FIG. 11, the film deposition method of this embodiment includes a placing step or process, a rotating step or process, a film deposition step or process, and a transporting step or process. The placing step places wafer W, as the substrate, on the turntable 2 within the vacuum chamber 1. The rotating step rotates the turntable 2. The film deposition step supplies the first and second reaction gases from the first and second reaction gas supply parts 31 and 32, supplies the first separation gas and the like from the first separation gas supply parts 41 and 42 and the like, moves the wafer W in accordance with the rotation of the turntable 2, and forms a thin film by repeating an operation of supplying the first reaction gas to the surface of the wafer W, stopping the supply of the first reaction gas, supplying the second reaction gas and stopping the supply of the second reaction gas. The transporting step stops the supply of the first and second reaction gases from the first and second reaction gas supply parts 31 and 32, stops heating the wafer W, stops the supply of each separation gas, stops the supply of each protection gas, stops the rotation of the turntable 2, and transports the wafer W by the transport arm 10.

First, the placing step is performed. The placing step places the wafer W on the turntable 2 within the vacuum chamber 1, as illustrated by a step S11 in FIG. 11.

More particularly, as illustrated in FIG. 9, the gate valve is opened, and the wafer W is transported from the outside by the transport arm 10 to the turntable 2 via the transport port 15, to be received by the recess 24 of the turntable 2. When the recess 24 stops at the position corresponding to the transport port 15 as illustrated in FIG. 9, the elevation pins 16 are raised from the bottom surface portion 14 of the vacuum chamber 1 through penetration holes in the bottom surface of the recess 24 so that the wafer W transported by the transport arm 10 may be received by the elevation pins 16, and the elevation pins 16 are thereafter lowered to receive the wafer W by the recess 24. Such a process of receiving the wafer W into the recess 24 is performed while intermittently rotating the turntable 2, and as a result, the wafer W is received in each of the five recesses 24 of the turntable 2.

Next, the rotating step is performed. The rotating step rotates the turntable 2, as illustrated by a step S12 in FIG. 11.

Next, a film deposition step is performed. The film deposition process includes steps S13 through S17 as illustrated in FIG. 11. The step S13 supplies the first protection gas and the second protection gas from the first protection gas supply part 55 and the second protection gas supply part 73. The step S14 supplies the first separation gas, the second separation gas, and the third separation gas from the first separation gas supply parts 41 and 42, the second separation gas supply part 51, and the third separation gas supply part 72. The step S15 heats the wafer W by the heater unit 7. The step S16 supplies the first reaction gas and the second reaction gas from the first reaction gas supply part 31 and the second reaction gas supply part 32. The step S17 repeats the operation of moving the wafer W with the rotation of the turntable 2, supplying the first reaction gas to the surface of the wafer W, stopping the supply of the first reaction gas, supplying the second reaction gas to the surface of the turntable 2, and stopping the supply of the second reaction gas, in order to form the thin film.

The step S13 may decompress the vacuum chamber 1 by the vacuum pump 64 to a preset pressure, and supply $N_2$ gases to the vacuum chamber 1 as the first protection gas and the second protection gas from the first protection gas supply part 55 and the second protection gas supply part 73.

The step S14 may supply $N_2$ gases to the vacuum chamber 1 as the first separation gas, the second separation gas, and the third separation gas from the first separation gas supply parts 41 and 42, the second separation gas supply part 51, and the third separation gas supply part 72.

The step S15 may heat the wafer W by the heater unit 7 to a temperature of 300° C., for example, after the wafer W is placed on the turntable 2. On the other hand, the turntable 2 may be preheated by the heater unit, 7 to a temperature of 300° C., for example, and the step S15 may be performed by placing the wafer W on this preheated turntable 2.

The step S16 may supply BTBAS gas and $O_3$ gas, as the first reaction gas and the second reaction gas, respectively, from the first reaction gas supply part 31 and the second reaction gas supply part 32, after confirming by a temperature sensor (not illustrated) that the temperature of the wafer W has reached the set temperature.

The sequence in which the steps S13, S14, S15 and S16 are performed is not limited to this order. The sequence in which the steps S13, S14, S15 and S16 are performed may be interchanged or, the steps S13, S14, S15 and S16 may be started or performed simultaneously. For example, it is possible to perform a procedure in which the BTBAS gas and the $O_3$ gas are respectively supplied as the first reaction gas and the second reaction gas from the first reaction gas supply part 31 and the second reaction gas supply part 32, and at the same timer the $N_2$ gas is supplied as the first separation gas from the first separation gas supply parts 41 and 42.

By performing the steps S13 through S16 in this manner, it is possible to move the wafer W with the rotation of the turntable 2, and the thin film may be formed on the wafer W by repeating the supply of the first reaction gas to the surface of the wafer W, stopping the supply of the first reaction gas, supplying the second reaction gas to the surface of the wafer W, and stopping the supply of the second reaction gas.

Because each wafer W alternately passes through the first space P1 where the first reaction gas supply part 31 is provided, and the second space P2 where the second reaction gas supply part 32 is provided, the BTBAS gas is adsorbed onto the wafer W, and then, the $O_3$ gas is adsorbed onto the wafer W. Thus, BTBAS molecules are oxidized, and a single molecular layer or a plurality of molecular layers of silicon oxide are formed on the wafer W. The molecular layers of silicon oxide are successively stacked, so that a silicon oxide film of a predetermined thickness is formed on the wafer W.

At the same time, $N_2$ gas is also supplied as the separation gas from the second separation gas supply part 51. Hence, the $N_2$ gas is ejected along the surface of the turntable 2 from the central part area C, that is, from the space between the protrusion portion 53 and the central part of the turntable 2. As mentioned above, in this embodiment, a portion of the inner wall of the vacuum chamber 1, that extends along the space under the first lower surface portion 45 and the second lower surface portion 45a where the first reaction gas supply part 31 and the second reaction gas supply part 32 are arranged, is cut out and a large space is formed. Because the exhaust ports 61 and 62 are located under this large space, the pressure in the space under the first lower surface portion 45 and the second lower surface portion 45a becomes lower than the pressure in each of the narrow space under the third lower surface portion 44 and the above-mentioned central part area C. This is because the narrow space under the third lower surface portion 44 is formed so that the pressure difference with the first (or second) space P1 (or P2) where the first (or second) reaction gas supply part 31 (or 32) is arranged can be maintained by the third height H3.

States of the gas flows when the gases are ejected from each of the parts are schematically illustrated in FIG. 12. The $O_3$ gas which is ejected downwards from the second reaction gas supply part 32 hits the surface of the turntable 2 (surface of the wafer W placed in the recess 24, the recess 24 having no wafer W placed therein, and the surface of the turntable 2 other than the recess 24) and flows along the surface of the turntable 2 towards the upstream side in the rotating direction. The $O_3$ gas flowing towards the upstream side is pushed back by the $N_2$ gas flowing from the upstream side in the rotating direction. Thus, the $O_3$ gas flows between the outer peripheral side of the protection top plate 4 and the upper end side of the protection cylinder 49a or, between the lower end side of the protection cylinder 49a and the outer peripheral side of the protection bottom plate 49b, and into the exhaust space 6 to be exhausted through the exhaust port 62.

In addition, the $O_3$ gas which is ejected downwards from the second reaction gas supply part 32, hits the surface of the turntable 2 and flows along the surface of the turntable 2 towards the upstream side in the rotating direction, tends to flow towards the exhaust port 62 due to the flow of the $N_2$ gas ejected from the central part area C and the suction by the exhaust port 62. A part of this $O_3$ gas flows towards the third space D located on the downstream side, and tends to flow into the space under the third lower surface portion 44 having the fan shape. However, the height of the third lower surface portion 44 and the length in the rotating direction of the third lower surface portion 44 are set so that the gas is prevented from flowing under the third lower surface portion 44 in the process parameters at the time of operation, including the flow rate of each gas. Thus, as also illustrated in FIG. 4B, the $O_3$ gas hardly flows under the third lower surface portion 44 or, only a small part of the $O_3$ gas flows under the third lower surface portion 44, and the $O_3$ gas cannot reach a position in the vicinity of the first separation gas supply part 41. In other words, the $O_3$ gas is pushed back to the upstream side in the rotating direction, that is, to the second space P2 side, by the $N_2$ gas ejected from the first separation gas supply part 41. Accordingly, the $O_3$ gas flows through the space between the outer peripheral side of the protection top plate 4 and the upper end side of the protection cylinder 49a or, the space between the lower end side of the protection cylinder 49a and the outer peripheral side of the protection bottom plate 49b, together with the $N_2$ gas ejected from the central part area C. This $O_3$ gas then flows into the exhaust space 6 and is exhausted through the exhaust port 62.

The BTBAS gas, which is ejected downwards from the first reaction gas supply part 31 and flows along the surface of the turntable 2 in directions towards the upstream side and the downstream side in the rotating direction, cannot flow under the adjacent third lower surface portions 44 having the fan shape and located on the upstream side and the downstream side, respectively. Even if the BTBAS gas does enter the space under the third lower surface portion 44, the BTBAS is pushed back to the first space P1 side, passes through the space between the outer peripheral side of the protection top plate 4 and the upper end side of the protection cylinder 49a or, between the lower end side of the protection cylinder 49a and the outer peripheral side of the protection bottom plate 49b, and is exhausted to the exhaust port 61 through the exhaust space 6 together with the $N_2$ gas ejected from the central part area C. That is, each third space D prevents the BTBAS gas and the $O_3$ gas, which are the reaction gases flowing in the atmosphere, from entering therein, but the gas molecules adsorbed onto the wafer W pass through the partitioned area, that is, under the third lower surface portion 44, and contribute to the film deposition.

The BTBAS gas in the first space P1 and the $O_3$ gas in the second space P2 tend to enter the central part area C. However, because the second separation gas is ejected from the central part area C towards the circumferential edge of the turntable 2 as illustrated in FIGS. 8 and 12, the BTBAS gas and the $O_3$ gas are prevented from entering the central part area C by the second separation gas. Even if a small part of the BTBAS gas or the $O_3$ gas does enter the central part area C, the gas is pushed back by the second separation gas. Thus, the BTBAS gas and the $O_3$ gas are prevented from entering the first space P1 and the second space P2 by passing through the central part area C.

In the third space D, the space between the protection cylinder 49a and the outer end surface of the turntable 2 is narrow as described above to substantially prevent the gas from passing therethrough. Hence, the BTBAS gas in the first space P1 (or the $O_3$ gas in the second space P2) is also prevented from flowing into the second space P2 (or the first space P1). Consequently, the environment of the first space P1 and the environment of the second space P2 are completely separated or isolated by the two third spaces D, and the BTBAS gas is exhausted by the exhaust port 61 while the $O_3$ gas is exhausted by the exhaust port 62. As a result, the BTBAS gas which is used as the first reaction gas and the $O_3$ gas which is used as the second reaction gas will not become mixed with each other within the environment or on the wafer W. In addition, in this example, because the $N_2$ gas which is used as the second separation gas is supplied under the turntable 2, the BTBAS gas which is used as the first reaction gas and flows into the exhaust space 6 cannot flow into the supply area of the $O_3$ gas which is used as the second reaction gas by passing under the turntable 2.

Furthermore, by supplying the first protection gas in the space between the protection top plate 4 and the protection cylinder 49a and the space between the top plate 11 of the vacuum chamber 1 and the chamber body 12, the pressure in the space between the spaces can be made 100 Pa higher, for example, than the pressure in the space that is surrounded by the protection top plate 4, the protection cylinder 49a and the protection bottom plate 49b. Accordingly, it is possible to prevent the first reaction gas and the second reaction gas from entering the space between the protection top plate 4 and the protection cylinder 49a and the space between the top plate 11 of the vacuum chamber 1 and the chamber body 12.

By measuring the pressure in the space between the protection top plate 4 and the protection cylinder 49a, the space between the top plate 11 of the vacuum chamber 1 and the chamber body 12, and the space that is surrounded by the protection top plate 4, the protection cylinder 49a and the protection bottom plate 49b using a pressure gauge and monitoring the measured pressures, the pressure in the space between the protection top plate 4 and the protection cylinder 49a and the pressure in the space between the top plate 11 of the vacuum chamber 1 and the chamber body 12 can be made 100 Pa higher, for example, than the pressure in the space that is surrounded by the protection top plate 4, the protection cylinder 49a and the protection bottom plate 49b. Hence, the film deposition can be performed while mutually separating the first reaction gas and the second reaction gas and protecting the vacuum chamber 1 from corrosion.

After the film deposition step, the transporting step or process is performed. The transporting step includes steps S18 through S20 illustrated in FIG. 11. The step S18 stops the supply of the first reaction gas and the second reaction gas from the first reaction gas supply part 31 and the second reaction gas supply part 32. The step S19 stops heating the wafer W, stops the supply of the first separation gas, the second separation gas and the third separation gas, stops the supply of the first protection gas and the second protection gas, and stops rotating the turntable 2. The step S20 transports the wafer W via the transport port 15 using the transport arm 10.

After the film deposition process is performed a plurality of times, a cleaning process may be performed to clean the inside of the film deposition apparatus to remove unwanted particles or deposits. In this case, a corrosive reaction gas is supplied from the first reaction gas supply part 31 and the second reaction gas supply part 32, as an etchant for use in etching unwanted deposits on the turntable 2 or the like. Although the etchant that is used is a corrosive gas such as chlorine, the cleaning process can be performed without causing deterioration of the vacuum chamber 1 due to corrosion, because the turntable 2, the first space P1, the second space P2 and the third space D are surrounded by the protection top plate 4 and the vacuum chamber protection part 49, and the corrosive reaction gas is prevented from entering the space between the vacuum chamber 1 and each of the protection top plate 4 and the vacuum chamber protection part 49.

Next, a description will be given of examples of the process parameters. If the wafer W having a diameter of 300 mm is used as the substrate to be processed, the rotational speed of the turntable 2 is set to 1 rpm to 500 rpm, for example, and the process pressure is set to 1067 Pa (or 8 Torr), for example. In addition, the heating temperature of the wafer W is set to 350° C., for example. The flow rates of the BTBAS gas and the $O_3$ gas are respectively set to 100 sccm and 10000 sccm, for example. The flow rate of the $N_2$ gas from the first separation gas supply parts 41 and 42 is set to 20000 sccm, for example, and the flow rate of the $N_2$ gas from the second separation gas supply part 51 at the central part of the vacuum chamber 1 is set to 5000 sccm, for example. Moreover, although a number of reaction gas supply cycles with respect to a single wafer, that is, a number of times the wafer passes each of the first space P1 and the second space P2 changes depending on a target film thickness, the number of times is set to 600 times, for example.

According to this embodiment, because the so-called ALD (or so-called MLD) is performed by arranging a plurality of wafers W in the rotating direction of the turntable 2 and rotating the turntable 2 to make each wafer W sequentially pass through the first space P1 and the second space P2, the film deposition process can be performed with a high throughput. The third space D having the low ceiling surface is provided between the first space P1 and the second space P2 in the rotating direction of the turntable 2, and the separation gas is ejected from the central part area C, which is defined by the rotation center part of the turntable 2 and the vacuum chamber 1 towards the circumferential edge of the turntable 2. The reaction gases are exhausted through the space between the protection top plate 4 and the protection cylinder 49a and the space between the protection cylinder 49a and the protection bottom plate 49b together with the separation gas diffusing to both sides of the third space D and the separation gas ejected from the central part area C. Thus, the reaction gases are prevented from being mixed with each other. As a result, a satisfactory film deposition process can be performed, and generation of reaction products on the turntable 2 is suppressed as much as possible, which in turn suppresses the generation of particles. It should be noted that the present invention is applicable to a case where a single wafer W is placed on the turntable 2.

In addition, because the vacuum chamber 1 is protected from corrosion by the protection top plate 4 and the vacuum chamber protection part 49, it is possible in this embodiment to perform a cleaning process to clean the turntable 2 or the like using a corrosive gas such as chlorine.

Reaction gases usable in this embodiment, other than the above-mentioned gases, include DCS (dichlorosilane), HCD (hexachlorodisilane), TMA (Trimethyl Aluminum), 3DMAS (tris(dimethyl amino)silane), TEMAZ (tetrakis-ethyl-methyl-amino-zirconium), TEMH (tetrakis-ethyl-methyl-amino-hafnium), Sr(THD)$_2$ (bis(tetra methyl heptandionate) strontium), Ti(MPD) (THD)$_2$ (methyl-pentadionate)(bis-tetra-methyl-heptandionate)titanium), monoamino-silane, and the like.

It is possible form a silicon nitride film in place of the silicon oxide film. In this case, it is possible to use as the first reaction gas and the second reaction gas a corrosive gas including chlorine, such as $SiH_2Cl_2$. In addition, when cleaning the turntable 2 or the like, a corrosive gas including chlorine, such as $ClF_3$, may be supplied from the first reaction gas supply part 31 and the second reaction gas supply part 32.

As described above, according to the film deposition apparatus of this embodiment, a high throughput can be obtained, and a plurality reaction gases are prevented from being mixed with each other on a substrate, which enables a satisfactory process to be performed. Further, it is possible to protect the vacuum chamber 1 from corrosion with respect to a plurality of reaction gases.

Although two kinds of reaction gases are used in the film deposition apparatus of this embodiment, the present invention is not limited to the use of two kinds of reaction gases, and the present invention is similarly applicable to a case where three or more kinds of reaction gases are sequentially supplied onto the substrate. For example, when using three kinds of reaction gases, namely, a first reaction gas, a second reaction gas and a third reaction gas, the areas of the lower surface of the protection top plate 4 including gas supply parts of each of the gases may be formed by arranging a first reaction gas supply part, a first separation gas supply part, a second reaction gas supply part, a first separation gas supply part, a third reaction gas supply part, and a first separation gas supply part in this order along a circumferential direction of the vacuum chamber 1.

First Modification of First Embodiment

Next, a description will be given of a film deposition apparatus in a first embodiment of the first embodiment of the present invention, by referring to FIG. 13.

Figure 13:
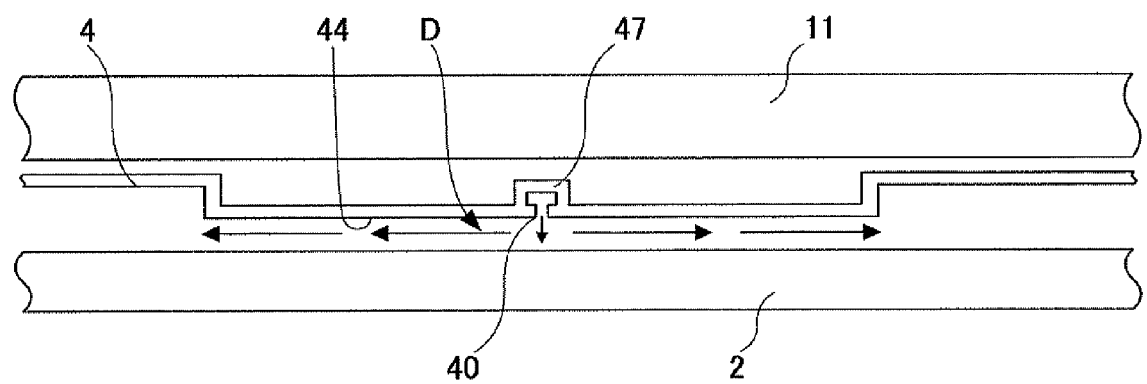
FIG. 13 is a view in vertical cross section illustrating another example of a shape of a protection top plate in the third lower surface portion, for explaining the film deposition apparatus in a first modification of the first embodiment of the present invention.

FIG. 13 is a diagram for explaining the film deposition apparatus in this modification, and illustrates a vertical cross section of another example of the shape of the protection top plate in the third lower surface portion. In the following description, parts that are described before are designated by the same reference numerals, and a description thereof may be omitted (the same applies to the modifications and embodiments described hereinafter).

The film deposition apparatus in this modification differs from the film deposition apparatus of the first embodiment in that a flow passage 47 of the first separation gas is formed to extend in a radial direction of the turntable 2 inside the protection top plate 4 in the third space D.

Unlike the first embodiment in which a groove is formed in a portion corresponding to the first separation gas supply part so that the third lower surface portion is arranged on both sides of the first separation gas supply part, in this modification, the flow passage 47 for the first separation gas is formed to extend in a radial direction of the turntable 2 inside the protection top plate 4 of the vacuum chamber 1 in the third space D. Further, a plurality of gas ejection holes 40 are provided in a bottom part of the flow passage 47 along a longitudinal direction thereof.

Accordingly, there is no need to newly provide a first separation gas supply part in addition to the flow passage 47, and it is possible to obtain the same effects as the first embodiment and the number of parts can be reduced.

In this modification, the first separation supply part 41, for example, is embedded in the protection to plate 4 forming the third lower surface portion 44. However, the structure of the combination of the third space D and the first separation gas supply part 41, for example, is not limited to that described above. As long as the first reaction gas and the second reaction gas are prevented from entering the space between the top plate 11 of the vacuum chamber 1 and the protection top plate 4, the protection top plate 4 may be divided into two parts at the first separation gas supply part 41, for example, in order to sandwich the first separation gas supply part 41 from both sides thereof.

Second Modification of First Embodiment

A description will be given of a film deposition apparatus in a second modification of the first embodiment of the present invention, by referring to FIGS. 14A through 14C.

Figure 14A:
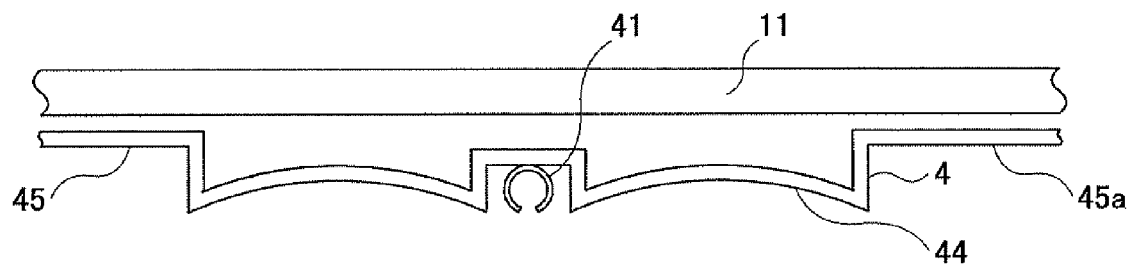
FIGS. 14A, 14B and 14C are views in vertical cross section illustrating other examples of the shape of a gas ejection hole in the first reaction gas supply part, for explaining the film deposition apparatus in a second modification of the first embodiment of the present invention.
Figure 14B:
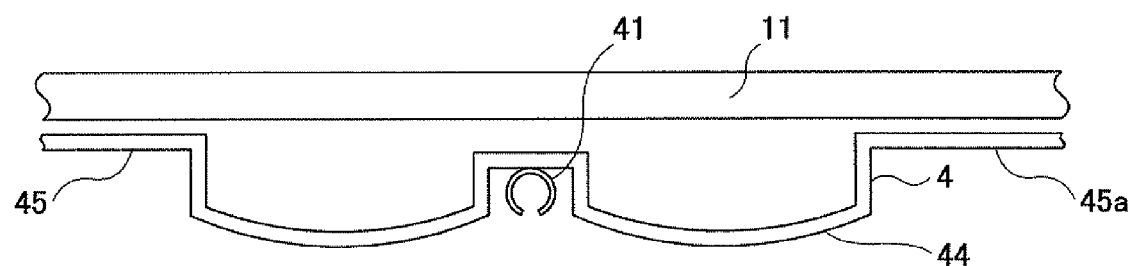
Figure 14C:
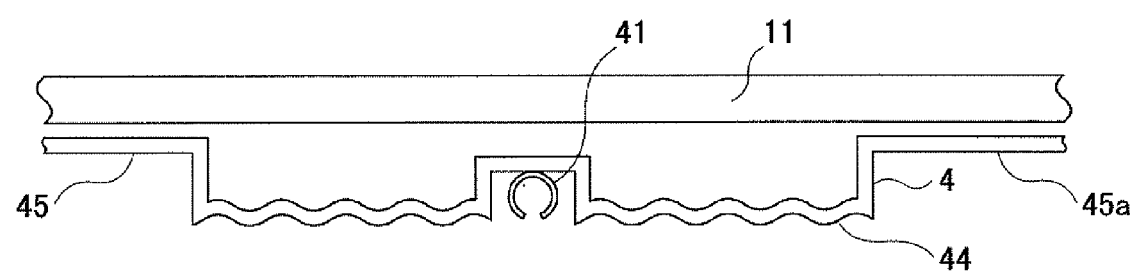

FIGS. 14A through 14C are diagrams for explaining the film deposition apparatus in this modification, and illustrate vertical cross sections of other examples of the shape of the lower surface the protection top plate in the third lower surface portion.

The film deposition apparatus in this modification differs from the film deposition apparatus of the first embodiment in that the third lower surface portion 44 in the third space D is a curved surface.

As illustrated in FIG. 14A through 14C, unlike the first embodiment in which the third lower surface portion 44 on both sides of the first separation gas supply part 41 is a flat surface, in this modification, the third lower surface portion 44 on both sides of the first separation gas supply part 41 is a curved surface.

The third lower surface portion 44 is not limited to the flat surface as is in the first embodiment, if the third lower surface portion 44 can separate the first reaction gas and the second reaction gas. For example, the third lower surface portion 44 may be a concave surface as illustrated in FIG. 14A or, a convex surface as illustrated in FIG. 14B or, a wavy surface as illustrated in FIG. 14C. In the case of the concave surface illustrated in FIG. 14A, it is possible to efficiently prevent the first reaction gas and the second reaction gas from entering the third lower surface portion 44 because the height from the turntable 2 to the third lower surface portion 44 can be decreased at an end part where the third lower surface portion 44 is adjacent to the first lower surface portion 45 or the second lower surface portion 45a. In the case of the convex surface illustrated in FIG. 14B, it is possible to efficiently prevent the first reaction gas and the second reaction gas from entering the third lower surface portion 44 because the height from the turntable 2 to the third lower surface portion 44 can be decreased at a position in the third lower surface portion 44 corresponding to a apex of the convex surface. In the case of the wavy surface illustrated in FIG. 14C, it is possible to efficiently prevent the first reaction gas and the second reaction gas from entering the third lower surface portion 44 because this case corresponds to a case where a plurality of apexes illustrated in FIG. 14B are provided.

Third Modification of First Embodiment

Next, a description will be given of a film deposition apparatus in a third modification of the first embodiment of the present invention, by referring to FIGS. 15A through 15C and FIGS. 16A through 16D.

Figure 15A:
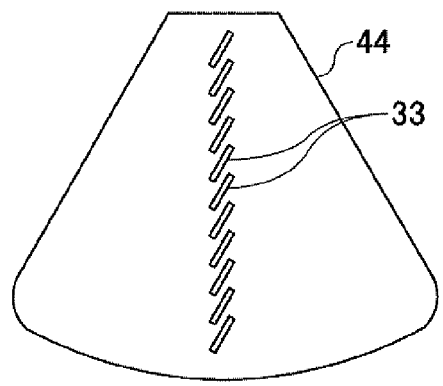
FIGS. 15A, 15B and 15C are bottom views illustrating other examples of the shape of the gas ejection hole in the first reaction gas supply part, for explaining the film deposition apparatus in a third modification of the first embodiment of the present invention.
Figure 15B:
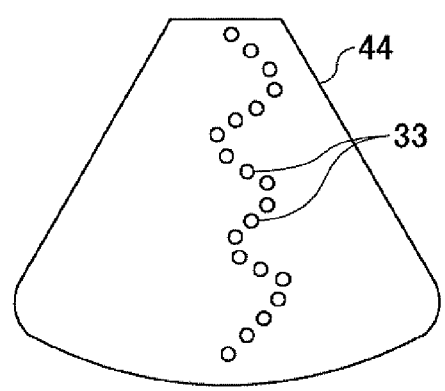
Figure 15C:
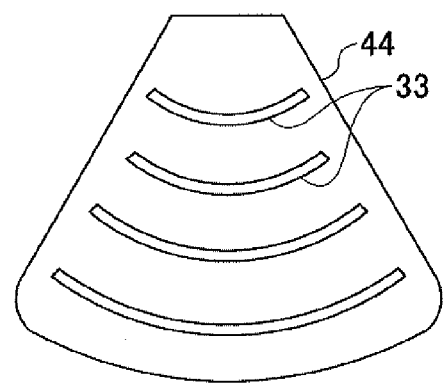

FIGS. 15A through 15C are diagrams for explaining the film deposition apparatus in this third modification of the first embodiment, and illustrate bottom views of other examples of the shape of the gas ejection hole in the first reaction gas supply part. FIGS. 16A through 16D are diagrams for explaining the film deposition apparatus in the third modification of the first embodiment, and illustrate bottom views of other examples of the shape of the third lower surface portion 44. FIGS. 15A through 15C illustrate the arranged positions of the third lower surface portion 44 and the ejection holes 33.

The film deposition apparatus in this modification differs from the film deposition apparatus of the first embodiment in that the ejection holes 33 formed in the first separation gas supply part 41, for example, are not linearly arranged from the circumferential edge to the rotation center of the turntable 2.

As illustrated in FIG. 15A through 15C, unlike the film deposition apparatus of the first embodiment in which the ejection holes formed in the first separation gas supply part are linearly arranged from the circumferential edge to the rotation center of the turntable, in this modification, the ejection holes 33 formed in the first separation gas supply part 41, for example, are not linearly arranged from the circumferential edge to the rotation center of the turntable 2 in the film deposition apparatus of this modification.

If the ejection holes 33 can supply the first separation gas uniformly to the wafer W, the ejection holes 33 are not limited to the arrangement in which the ejection holes 33 are linearly arranged from the circumferential edge to the rotation center of the turntable 2, and the following arrangement may be employed.

As illustrated in FIG. 15A, a plurality of ejection holes 33 formed as rectangular slits oblique to a diametral (or radial) line of the turntable 2 may be arranged in a linear pattern along the radial direction at predetermined intervals. As illustrated in FIG. 15B, a plurality of ejection holes 33 having a circular shape may be arranged in a winding (or serpentine) or zigzag pattern. As illustrated in FIG. 15C, a plurality of ejection holes 33 formed as arcuate slits may be arranged in concentric pattern with respect to the rotation center of the turntable 2.

The third lower surface portion 44 may be hollow and form a cavity, so that the first separation gas is introduced into the cavity. In this case, the plurality of ejection holes 33 may be arranged as illustrated in any of FIGS. 15A, 15B and 15C.

Figure 16A:
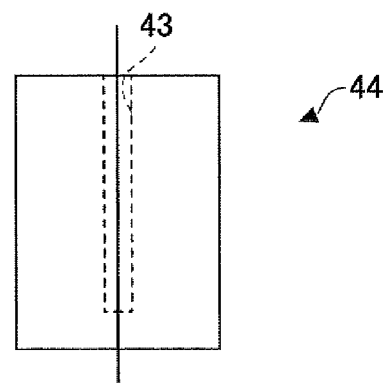
FIGS. 16A, 16B, 16C and 16D are bottom views illustrating other examples of the shape of the third lower surface portion, for explaining the film deposition apparatus in the third modification of the first embodiment of the present invention.
Figure 16B:
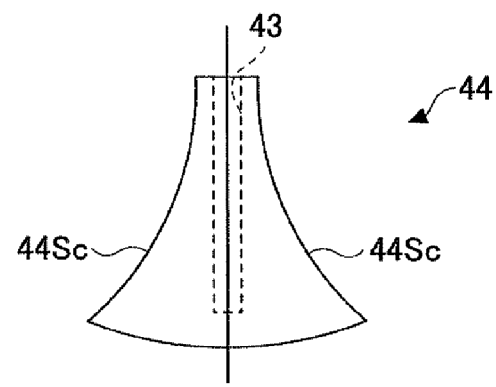
Figure 16C:
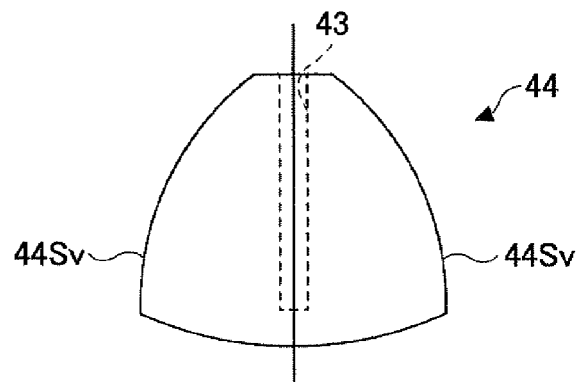
Figure 16D:
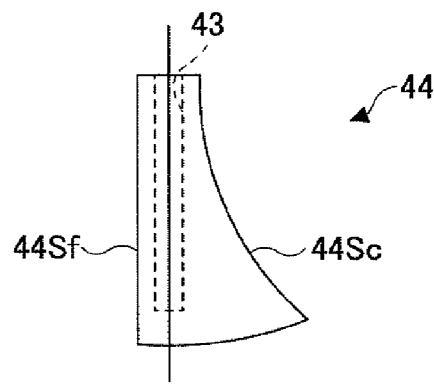

Although the third lower surface portion 44 has a generally fan shape in this modification, the third lower surface portion 44 may have a rectangular shape as illustrated in FIG. 16A or a square shape. The top surface of the third lower surface portion 44 may have a fan shape as a whole and the third lower surface portion 44 may have side surfaces 44Sc that are curved in a concave shape, as illustrated in FIG. 16B. In addition, the top surface of the third lower surface portion 44 may have a fan shape as a whole and the third lower surface portion 44 may have side surfaces 44Sv that are curved in a convex shape, as illustrated in FIG. 16C. Further, as illustrated in FIG. 16D, a portion of the third lower surface portion 44 on the upstream side in the rotating direction of the turntable 2 (FIG. 1) may have a side surface 44Sc that is curved in a concave shape, and a portion of the third lower surface portion 44 on the downstream side in the rotating direction of the turntable 2 (FIG. 1) may have a side surface 44Sf that has a flat shape. It should be noted that, in FIGS. 16A through 16D, dotted lines indicate a groove part 43 (FIGS. 4A and 4B) formed in the third lower surface portion 43. In these cases, the first separation gas supply parts 41 and 42 (FIG. 2) may extend from the central part of the vacuum pump 1, that is, from the protrusion portion 53 (FIG. 1).

According to the arrangement of the ejection holes 33 described above, the first separation gas is more uniformly supplied in the third lower surface portion 44, and it is possible to more efficiently prevent the first reaction gas and the second reaction gas from entering the third lower surface portion 44.

Fourth Modification of First Embodiment

Next, a description will be given of a film deposition apparatus in a fourth modification of the first embodiment of the present invention, by referring to FIG. 17.

Figure 17:
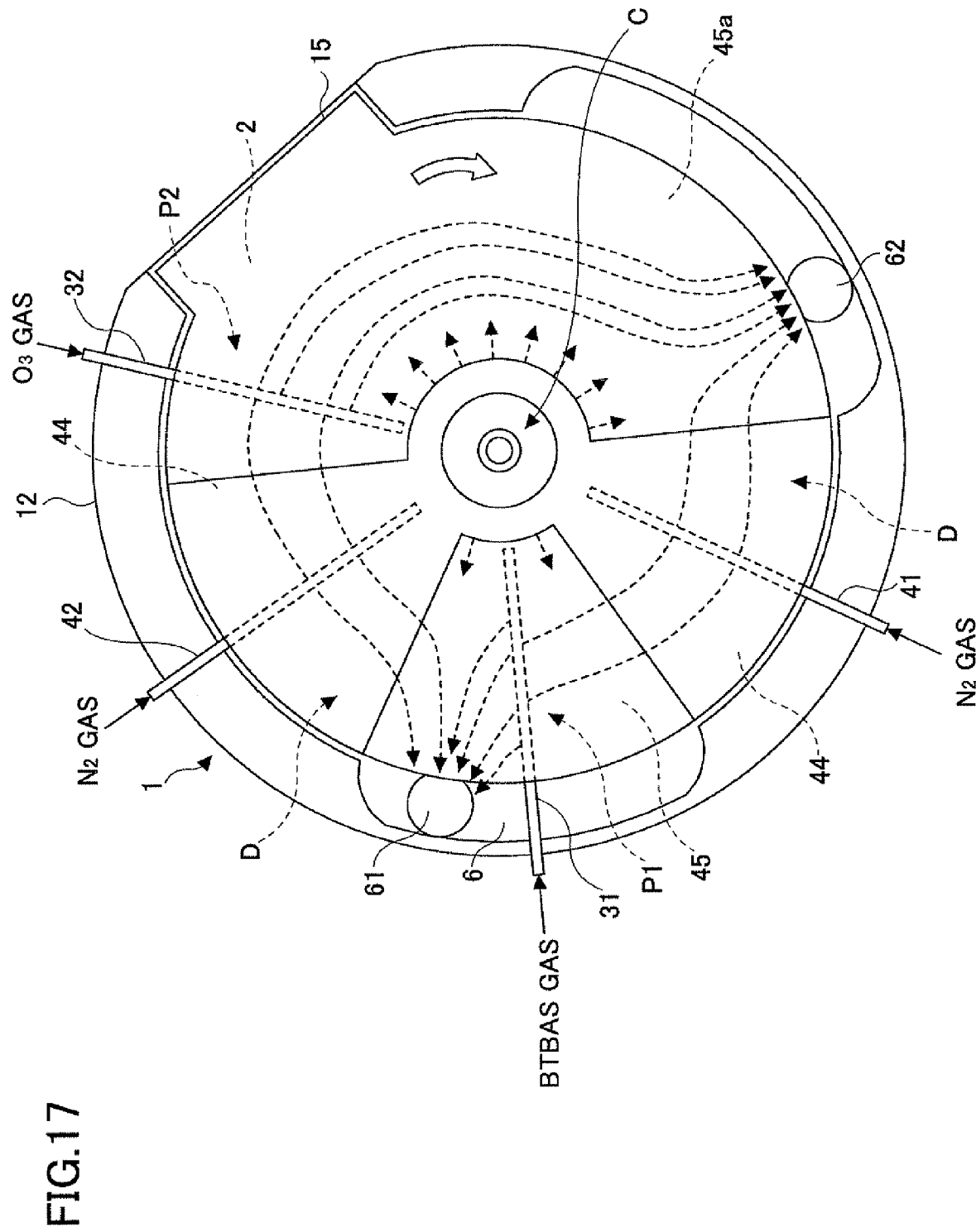
FIG. 17 is a plan view schematically illustrating a structure of the film deposition apparatus in a fourth modification of the first embodiment of the present invention.

FIG. 17 is a plan view schematically illustrating the film deposition apparatus in the sixth modification. FIG. 17 illustrates the film deposition apparatus in a state where the top plate 11 of the vacuum chamber 1 is removed.

The film deposition apparatus in this modification differs from the film deposition apparatus of the first embodiment in that the second reaction gas supply part 32 is provided on the upstream side of the transport port 15 in the rotating direction of the turntable 2.

Unlike the first embodiment in which the second reaction gas supply part is provided on the downstream side of the transport port in the rotating direction of the turntable, in this modification, the second reaction gas supply part 32 is provided on the upstream side of the transport port 15 in the rotating direction of the turntable 2.

According to this layout, the first reaction gas and the second reaction gas can be more efficiently separated from each other, and the first separation gas can be prevented from entering the first lower surface portion 45 and the second lower surface portion 45a. For this reason, in the first lower surface portion 45 and the second lower surface portion 45a, each of the first reaction gas and the second reaction gas can be more efficiently supplied to the wafer W.

Fifth Modification of First Embodiment

Next, a description will be given of a film deposition apparatus in a fifth modification of the first embodiment of the present invention, by referring to FIG. 18.

Figure 18:
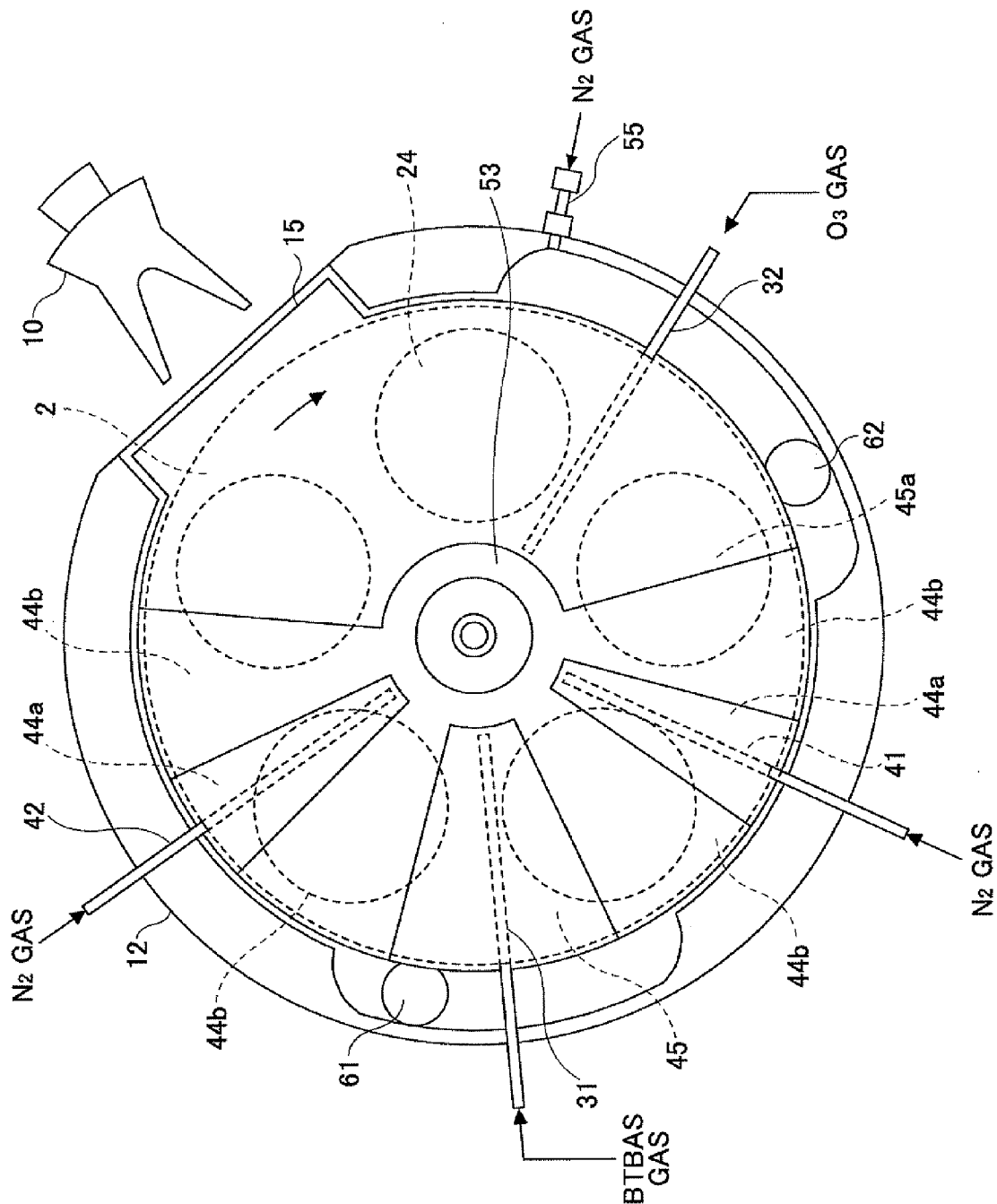
FIG. 18 is a plan view schematically illustrating a structure of the film deposition apparatus in a fifth modification of the first embodiment of the present invention.

FIG. 18 is a plan view schematically illustrating of a structure of the film deposition apparatus in the fifth modification. FIG. 18 illustrates the film deposition apparatus in a state where the top plate 11 of the vacuum chamber 1 is removed.

The film deposition apparatus of this modification differs from the film deposition apparatus of the first embodiment in that the third lower surface portion 44 is divided into two areas along the circumferential direction, and a first separation gas supply part is provided between the two areas.

Unlike the first embodiment in which the height from the turntable to the lower surface of the protection top plate is the same at all parts of the third lower surface portion, in this modification, there are provided a third lower surface portion 44a which includes the first separation gas supply parts 41 and 42 and is provided at a position higher than the height H3 from the turntable 2, and a third lower surface portion 44b which is adjacent to the third lower surface portion 44a and is provided at the height H3 from the turntable 2.

By providing the two areas that are obtained by dividing the third lower surface portion 44 into two as described above, the first reaction gas and the second reaction gas can be more efficiently separated from each other, and it is possible to prevent the first separation gas from entering the first lower surface portion 45 and the second lower surface portion 45a. For this reason, the first reaction gas and the second reaction gas can be more efficiently supplied to the wafer W in the first lower surface portion 45 and the second lower surface portion 45a.

The distance between the third lower surface portion 44b and each of the first separation gas supply parts 41 and 42 and the shape and the size of the third lower surface portion 44b may be optimized by design by taking into account parameters such as the flow rates of the first reaction gas, the second reaction gas and the first separation gas.

Sixth Modification of First Embodiment

Next, a description will be given of a film deposition apparatus in a sixth modification of the first embodiment of the present invention, by referring to FIG. 19.

Figure 19:
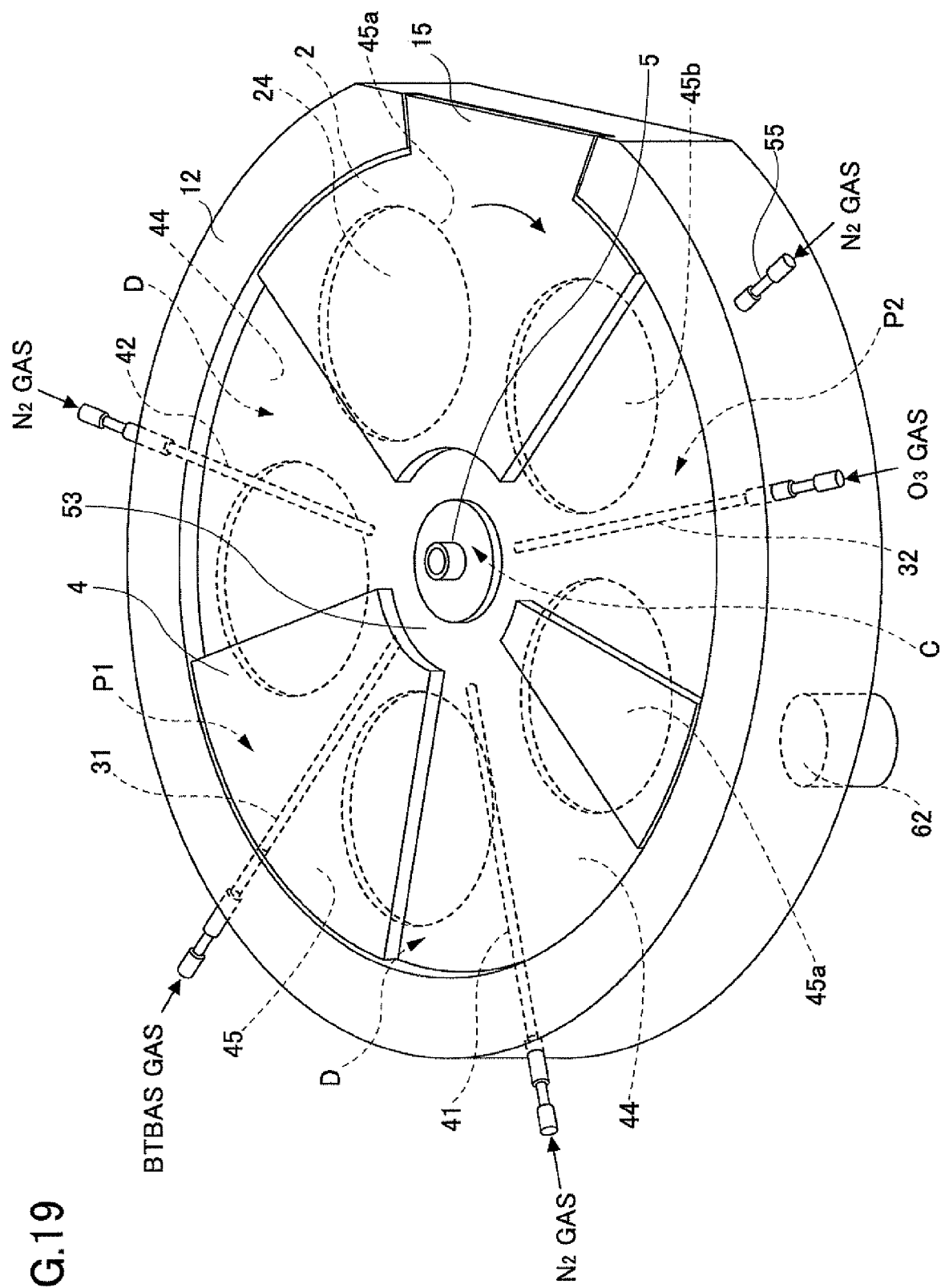
FIG. 19 is a perspective view schematically illustrating a structure of the film deposition apparatus in a sixth modification of the first embodiment of the present invention.

FIG. 19 is a perspective view illustrating a structure of the film deposition apparatus in the eighth modification.

The film deposition apparatus of this modification differs from the film deposition apparatus of the first embodiment in that a sixth lower surface portion 45b and a seventh lower surface portion 45a are provided in place of the second lower surface portion 45a.

Unlike the first embodiment in which the height from the turntable to the lower surface of the protection top plate of the vacuum chamber is the same at all parts of the second lower surface portion, in this modification, a sixth lower surface portion 45b and a seventh lower surface portion 45a are provided in place of the second lower surface portion 345a. The sixth lower surface portion 45b includes the second reaction gas supply part 32, and is located at a position lower than the second height H2 from the turntable 2. The seventh lower surface portion 45a is adjacent to the sixth lower surface portion 45b, and is located at the second height H2 from the turntable 2.

Accordingly, the sixth lower surface portion 45b has the same structure as the third lower surface portion 44, except that the second reaction gas supply part 32 is provided in place of the first separation gas supply part 41 or 42.

By providing the sixth lower surface portion 45b, the first reaction gas and the second reaction gas can be more efficiently separated from each other, and the first separation gas and the first reaction gas are prevented from entering the sixth lower surface portion 45b. Accordingly, the second reaction gas can be more efficiently supplied to the wafer W in the sixth lower surface portion 45b.

The sixth lower surface portion 45b may have the same structure as one of the hollow third lower surface portions 44 illustrated in FIGS. 15A through 15C.

Although the sixth lower surface portion 45b and the seventh lower surface portion 45a are provided in place of the second lower surface portion 45a in this modification, a fourth lower surface portion and a fifth lower surface portion may be provided in place of the first lower surface portion 45. In this case, the fourth lower surface portion is configured to include the first reaction gas supply part 31, and is located at a position lower than the first height H1 from the turntable 2. Further, the fifth lower surface portion is configured to be adjacent to the fourth lower surface portion, and is located at the first height H1 from the turntable 2. By providing the fourth lower surface portion, the first reaction gas and the second reaction gas can be more efficiently separated from each other, and the first separation gas and the first reaction gas are prevented from entering the fourth lower surface portion. Accordingly, the first reaction gas can be more efficiently supplied to the wafer W in the fourth lower surface portion.

Seventh Modification of First Embodiment

Next, a description will be given of a film deposition apparatus in a seventh modification of the first embodiment of the present invention, by referring to FIG. 20.

Figure 20:
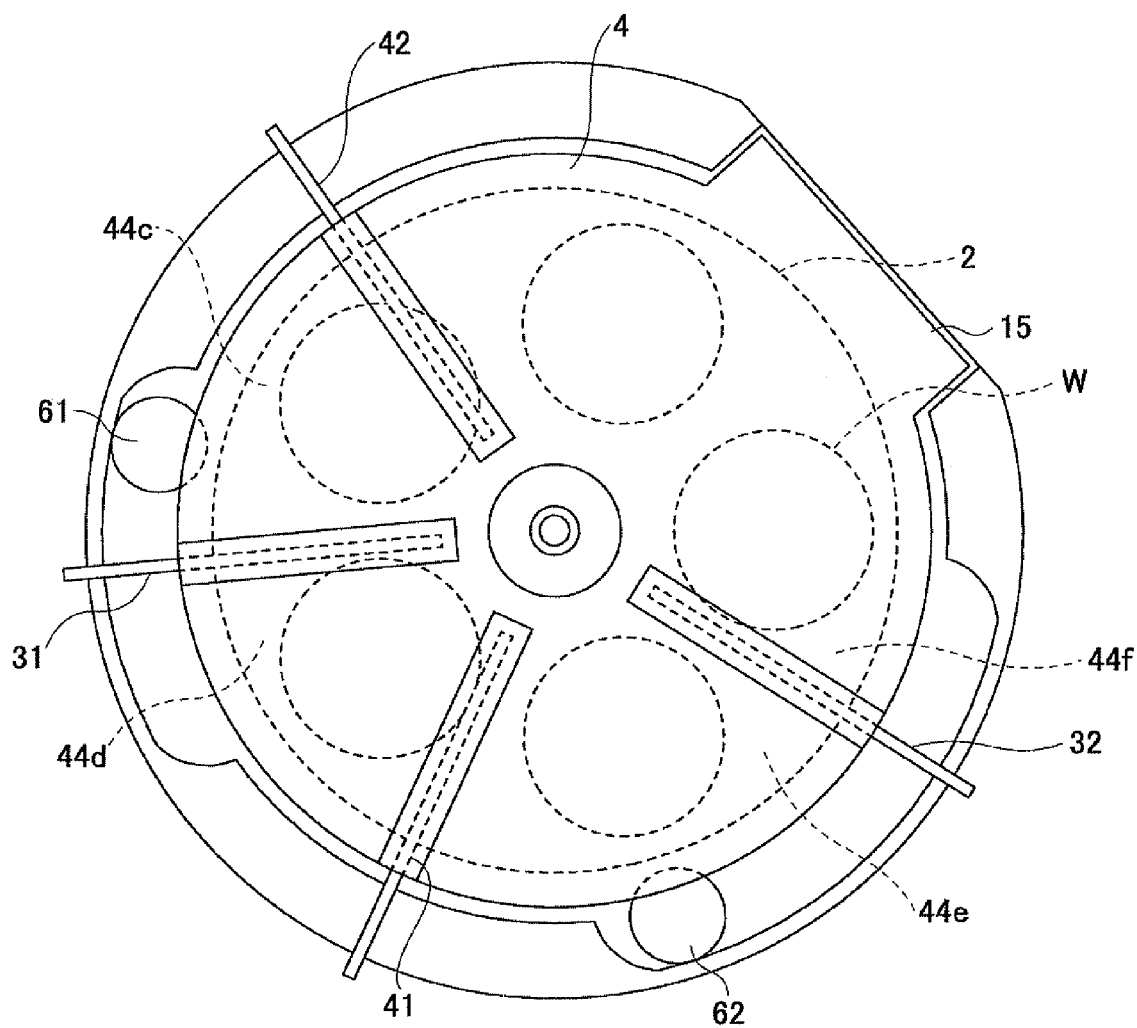
FIG. 20 is a plan view schematically illustrating a structure of the film deposition apparatus in a seventh modification of the first embodiment of the present invention.

FIG. 20 is a plan view schematically illustrating a structure of the film deposition apparatus in the seventh modification. FIG. 20 illustrates the film deposition apparatus in a state where the top plate of the vacuum chamber is removed.

The film deposition apparatus of this modification differs from the film deposition apparatus of the first embodiment in that a low ceiling is provided on both sides of the first reaction gas supply part and the second reaction gas supply part.

Unlike the first embodiment in which the third lower surface portion having the ceiling surface lower than the first lower surface portion and second lower surface portion to form the narrow space on both sides of the first separation gas supply part, in this modification, third lower surface portions 44c through 44f, which have low ceiling surfaces similarly to the third lower surface portion 44, are provided on both sides of the first reaction gas supply part 31 and the second reaction gas supply part 32. In addition, these third lower surface portions 44c through 44f are continuous.

Except for the areas where the first separation gas supply part 41 (or 42), first reaction gas supply part 31 and the second reaction gas supply part 32 are provided, the third lower surface portions 44c through 44f are provided in the entire area opposing the turntable 2. In other words, this structure is an example of a case where the third lower surface portions 44 on both sides of the first separation gas supply part 41 (or 42) are expanded to the first and second reaction gas supply parts 31 and 32. In this case, the first separation gas diffuses on both sides of the first separation gas supply part 41 (or 42), and the first reaction gas and the second reaction gas diffuse on both sides of the first reaction gas supply part 31 and the second reaction gas supply part 32, respectively. The first separation gas and each of the first and second reaction gases join together in the narrow space between the rotation table 2 and each of the third lower surface portions 44c through 44f. However, these gases that join are exhausted through the exhaust port 61 (or 62) located between the first (or second) reaction gas supply part 31 (or 32) and the first separation gas supply part 42 (or 41). Therefore, this modification can also obtain the same effects as the first embodiment.

The third lower surface portions 44c through 44f may be combined with the hollow lower surface portion illustrated in any of FIGS. 15A through 15C, in order to eject the first reaction gas, the second reaction gas and the separation gas from the ejection holes 33 in the corresponding hollow third lower surface portions 44c through 44f, without the use of the first reaction gas supply part 31, the second reaction gas supply part 32 and the first separation gas supply parts 41 and 42.

Eighth Modification of First Embodiment

Next, a description will be given of a film deposition apparatus in an eighth modification of the first embodiment of the present invention, by referring to FIG. 21.

Figure 21:
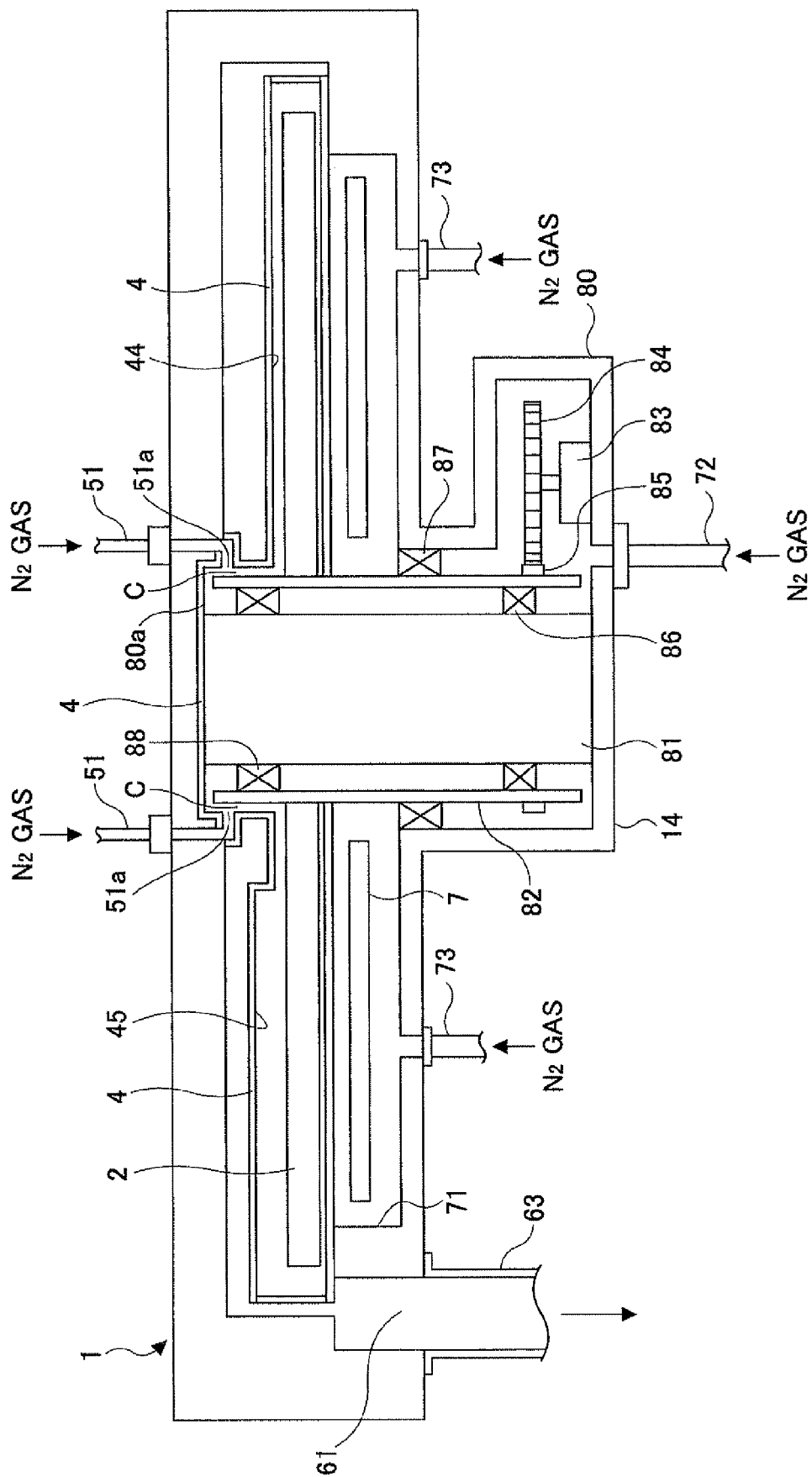
FIG. 21 is a view in vertical cross section schematically illustrating a structure of the film deposition apparatus in an eighth modification of the first embodiment of the present invention.

FIG. 21 is a view in vertical cross section schematically illustrating the film deposition apparatus in the eighth modification.

The film deposition apparatus of this modification differs from the film deposition apparatus of the first embodiment in that a column 81 is provided between the bottom part of the vacuum chamber 1 and the protection top plate 4 at the central part of the vacuum chamber 1 in order to prevent mixing of the reaction gases.

Unlike the first embodiment in which the rotary shaft of the turntable is provided in the central part of the vacuum chamber and the separation gas is purged into the space between the central part of the turntable and the protection top plate, in this modification, a concave portion 80a is formed in the central area of a ceiling surface of the vacuum chamber 1, and a column 81 is provided between an upper surface of the concave portion 80a and a bottom part of an accommodation part 80, via the protection top plate 4, at the central part of the vacuum chamber 1. The bottom surface portion 14 in the central area of the vacuum chamber 1 protrudes downwards to form the accommodation part 80 for a drive part. Hence, the BTBAS gas from the first reaction gas supply part 31 and the O₃ gas from the second reaction gas supply part 32 are prevented from being mixed with each other at the central part of the vacuum chamber 1.

A mechanism for rotating the turntable 2 may include a rotation sleeve 82 that surrounds the column 81. The turntable 21 having a ring shape is provided along an outer surface of the rotation sleeve 82. A drive gear part 84, which is driven by a motor 83, is provided in the accommodation part 80 so that the rotation sleeve 82 is rotated by the drive gear part 84. The rotation sleeve 82 is rotatably supported by baring parts 86, 87 and 88. A third separation gas supply part 72 is connected to the bottom part of the accommodation part 80 to supply the third separation gas, and a second separation gas supply part 51 is connected to a top part of the vacuum chamber 1 to supply the second separation gas to a space between a side surface of the concave portion 80a and an upper end part of the rotation sleeve 82. In FIG. 21, although two opening parts 51a for supplying the second separation gas to the space between the side surface of the concave portion 80a and the upper end part of the rotation sleeve 82 are illustrated on the right and left sides, it is desirable to determine the number of opening parts 51a (or the second separation gas supply parts 51) to prevent the BTBAS gas and the O₃ gas from being mixed with each other through an area adjacent to the rotation sleeve 82.

In the example illustrated in FIG. 21, when viewed from the side of the turntable 2, the space between the side surface of the concave portion 80a and the upper end part of the rotation sleeve 82 corresponds to the separation gas ejection hole. In addition, the central part area C at the central part of the vacuum chamber 1 is defined by the separation gas ejection hole, the rotation sleeve 82, the column 81 and the protection top plate 4.

Second Embodiment

Next, a description will be given of a substrate processing apparatus in a second embodiment of the present invention, by referring to FIG. 22.

Figure 22:
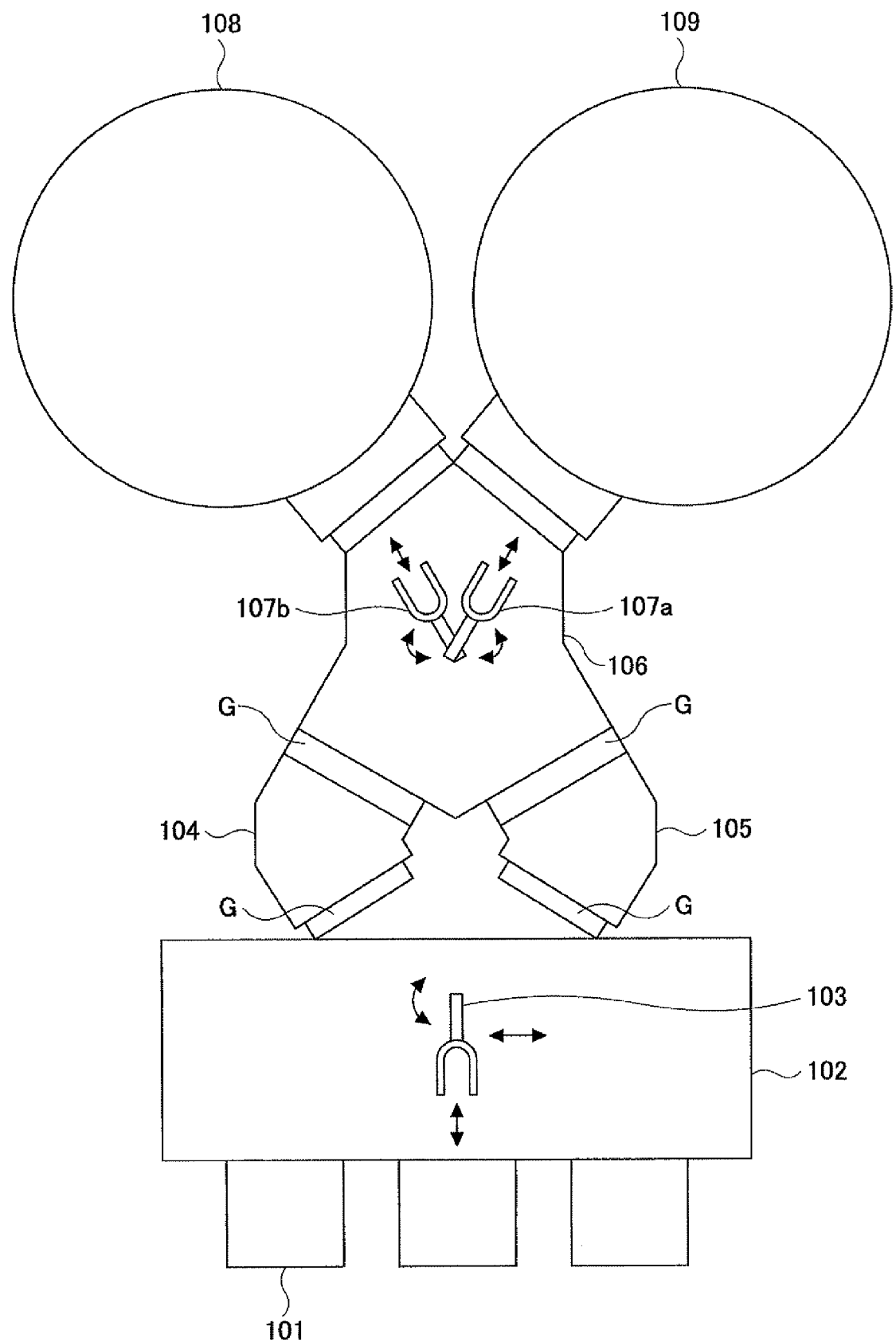
FIG. 22 is a plan view schematically illustrating a structure of a substrate processing apparatus in a second embodiment of the present invention.

FIG. 22 is a plan view schematically illustrating a structure of the substrate processing apparatus in the second embodiment of the present invention.

As illustrated in FIG. 22, the substrate processing apparatus of this embodiment includes a transport container 101, an atmosphere transport chamber 102, a transport arm 103, load lock chambers 104 and 105 (corresponding to preliminary vacuum chambers of this embodiment), a vacuum transport chamber 106, transport arms 107, and film deposition apparatuses 108 and 109. The load lock chambers 104 and 105 are connected to the vacuum transport chamber 106 in an air-tight manner. The vacuum transport chamber 106 is connected to the film deposition apparatuses 108 and 109 in an air-tight manner.

The transport container 101 is an enclosure type container referred to as FOUP, which accommodates, for example, 25 wafers. The transport arm 103 is located inside the atmosphere transport chamber 102. An environment in the load lock chambers 104 and 105 can be switched or changed between an atmospheric environment and a vacuum environment. The two transport arms 107 are located inside the vacuum transport chamber 106. Each of the film deposition apparatuses 108 and 109 corresponds to the film deposition apparatus of the first embodiment of the present invention.

The transport container 101 is transported from the outside to a carry in/out port having a placement stage which is not illustrated in the figure. After the transport container 101 is placed on the placement stage, a lid of the atmosphere transport chamber 102 is opened by an open-close mechanism which is not illustrated in the figure, and the wafer is taken out of the transport container 101 by the transport arm 103. The wafer taken out of the transport container 101 is transported into the load lock chamber 104 or 105. Then, the inside the load lock chamber 104 or 105 is changed from the atmospheric environment to the vacuum environment. Next, the wafer is taken out of the load lock chamber 104 or 105 by the transport arm 107, and is transported to the film deposition apparatus 108 or 109. Thereafter, a film deposition process is performed in the film deposition apparatus 108 or 109 according to the film deposition method described above in conjunction with the first embodiment.

According to this second embodiment, because the substrate processing apparatus includes a plurality of film deposition apparatuses (for example, two film deposition apparatuses), each of which can process five wafers at a time, for example, the film deposition process according to ALD or MLD can be performed with a high throughput.

In addition, according to this second embodiment, because each of the film deposition apparatuses 108 and 109 corresponds to the film deposition apparatus of the first embodiment of the present invention, the turntable, the first space, the second space and the third space within the film deposition apparatus are surrounded by the protection top plate and the vacuum chamber protection part. As a result, it is possible to protect the vacuum chamber from corrosion with respect to the first reaction gas and the second reaction gas.

Further, the present invention is not limited to these embodiments, but various variations and modifications may be made without departing from the scope of the present invention.

What is claimed is:

1. A film deposition apparatus comprising:
   a turntable rotatably provided in a vacuum chamber and having an upper surface with a plurality of substrate receiving parts each configured to receive a corresponding one of a plurality of substrates;
   a first reaction gas supply part and a second reaction gas supply part, extending from mutually different positions along a circumferential edge of the turntable towards a rotation center of the turntable, configured to supply the first reaction gas and the second reaction gas, respectively;
   a first separation gas supply part extending from a position along the circumferential edge of the turntable between the first reaction gas supply part and the second reaction gas supply part towards the rotation center of the turntable, configured to supply a first separation gas for separating the first reaction gas and the second reaction gas from each other;
   a protection top plate, having a lower surface opposing the upper surface of the turntable, and configured to protect the vacuum chamber against corrosion from the first reaction gas and the second reaction gas;
   a first lower surface portion located at a first distance from the upper surface of the turntable, and included in the lower surface of the protection top plate which includes the first reaction gas supply part, to thereby form a first space between the first lower surface portion and the turntable;
   a second lower surface portion located at a second distance from the upper surface of the turntable at a position separated from the first lower surface portion, and included in the lower surface of the protection top plate which includes the second reaction gas supply part, to thereby form a second space between the second lower surface portion and the turntable;

a third lower surface portion located at a third distance from the upper surface of the turntable, and included in the lower surface of the protection top plate which includes the first separation gas supply part and is located on both sides of the first separation gas supply part along a rotating direction of the turntable, to thereby form a third space between the third lower surface portion and the turntable, said third distance being shorter than each of the first distance and the second distance, and said third space having the third distance to flow the first separation gas from the first separation gas supply part to the first space and the second space;

a vacuum chamber protection part configured to surround the turntable, the first space, the second space and the third space, together with the protection top plate, and protect the vacuum chamber from corrosion with respect to the first reaction gas and the second reaction gas;

a second separation gas supply part, provided in a central part area included in the lower surface of the protection top plate on a side of the plurality of substrate receiving parts relative to the rotation center of the turntable, and configured to supply a second separation gas for separating the first reaction gas and the second reaction gas from each other; and an exhaust port configured to exhaust the first reaction gas and the second reaction gas together with the first separation gas ejected to both sides of the third space and the second separation gas ejected from the central part area, wherein the third lower surface portion has a fan shape which increases in width from the rotation center towards the circumferential edge of the turntable on a plane parallel to the upper surface of the turntable, wherein a thin film is deposited on the plurality of substrates in the vacuum chamber by carrying out a supply cycle to sequentially supply at least two kinds of source gases, including the first reaction gas and the second reaction gas, by the first and second reaction gas supply parts, wherein each of the first, third, and second spaces forms a part of a continuous space formed between the lower surface of the protection top plate and the upper surface of the turntable, and wherein the continuous space has a ring shape that extends along a circumferential direction of the turntable about the rotation center in a plan view of the film deposition apparatus viewed from above the turntable in a direction perpendicular to the upper surface of the turntable, such that the first, third, and second spaces are arranged along the circumferential direction in the plan view and a distance of the lower surface of the protection top plate from the upper surface of the turntable varies along the circumferential direction.

2. The film deposition apparatus as claimed in claim 1, wherein the protection top plate and the vacuum chamber protection part are made of quartz or ceramics.

3. The film deposition apparatus as claimed in claim 1, further comprising:
a first protection gas supply part, disposed between a top plate of the vacuum chamber and the protection top plate, and configured to supply a first protection gas to protect the vacuum chamber from corrosion.

4. The film deposition apparatus as claimed in claim 3, further comprising:
a second protection gas supply part, disposed between a bottom of the vacuum chamber and the vacuum chamber protection part, and configured to supply a second protection gas to protect the vacuum chamber from corrosion.

5. The film deposition apparatus as claimed in claim 1, further comprising:
a third separation gas supply part, disposed under the rotation center of the turntable, and configured to supply a third separation gas for separating the first reaction gas and the second reaction gas from each other.

6. The film deposition apparatus as claimed in claim 1, further comprising:
a column disposed at a central part of the vacuum chamber between the lower surface of the protection top plate and a bottom of the vacuum chamber; and
a rotation sleeve rotatable about a vertical axis and surrounding the column,
wherein the rotation sleeve forms a rotary shaft of the turntable.

7. The film deposition apparatus as claimed in claim 1, wherein a surface of each of the plurality of substrates placed in the substrate receiving parts is located at a level which is lower than or equal to a level of the upper surface of the turntable.

8. The film deposition apparatus as claimed in claim 1, wherein gas inlet ports for introducing gases to the first reaction gas supply part, the second reaction gas supply part and the first separation gas supply part are disposed on the rotation center side or the circumferential edge side of the turntable.

9. The film deposition apparatus as claimed in claim 1, wherein the first separation gas supply part includes a plurality of ejection holes arranged in a direction from the rotation center towards the circumferential edge of the turntable.

10. The film deposition apparatus as claimed in claim 1, further comprising:
a first exhaust port and a second exhaust port disposed at a periphery in a bottom of the vacuum chamber in vicinities of the first space and the second space, respectively.

11. The film deposition apparatus as claimed in claim 1, wherein a pressure within the third space is set higher than a pressure within the first space and a pressure within the second space.

12. A substrate processing apparatus comprising:
a film deposition apparatus according to claim 1;
a vacuum transport chamber connected to the film deposition apparatus in an air-tight manner, and having a substrate transport part provided therein; and
a load lock chambers connected to the vacuum transport chamber in an air-tight manner, and having an environment therein switched between an atmospheric environment and a vacuum environment.

13. A film deposition apparatus comprising:
a turntable rotatably provided in a vacuum chamber and having an upper surface configured to receive a plurality of substrates;
first and second reaction gas supply parts, extending from mutually different positions along a circumferential edge of the turntable towards a rotation center of the turntable, configured to supply the first and second reaction gases, respectively;
a first separation gas supply part extending from a position along the circumferential edge of the turntable between the first and second reaction gas supply parts towards the rotation center, configured to supply a first separation gas for separating the first and second reaction gases from each other;

a protection top plate, having a lower surface opposing the upper surface of turntable, and configured to protect the vacuum chamber against corrosion from the first and second reaction gases, wherein the lower surface of the protection top plate includes a first surface portion including the first reaction gas supply part and located at a first distance from the upper surface of the turntable, to thereby form a first space between the first surface portion and the turntable, a second surface portion including the second reaction gas supply part and located at a second distance from the upper surface of the turntable at a position separated from the first surface portion, to thereby form a second space between the second surface portion and the turntable, and a third surface portion, arranged on both sides of the first separation gas supply part along a rotating direction of the turntable, including the first separation gas supply part and located at a third distance that is shorter than each of the first and second distances from the upper surface of the turntable, to thereby form a third space between the third surface portion and the turntable to flow the first separation gas from the first separation gas supply part to the first and second spaces;

a vacuum chamber protection part configured to surround the turntable and the first, second and third spaces, together with the protection top plate;

a second separation gas supply part, provided in a central part area of the lower surface of the protection top plate in a vicinity of the rotation center, and configured to supply a second separation gas for separating the first and second reaction gases from each other; and an exhaust port configured to exhaust the first and second reaction gases together with the first separation gas ejected to both sides of the third space and the second separation gas ejected from the central part area, wherein the third surface portion has a fan shape which increases in width from the rotation center towards the circumferential edge of the turntable on a plane parallel to the upper surface of the turntable, wherein a thin film is deposited on the plurality of substrates in the vacuum chamber by carrying out a supply cycle to sequentially supply the first and second reaction gases by the first and second reaction gas supply parts, wherein each of the first, third, and second spaces forms a part of a continuous space formed between the lower surface of the protection top plate and the upper surface of the turntable, and wherein the continuous space has a ring shape that extends along a circumferential direction of the turntable about the rotation center in a plan view of the film deposition apparatus viewed from above the turntable in a direction perpendicular to the upper surface of the turntable, such that the first, third, and second spaces are arranged along the circumferential direction in the plan view and a distance of the lower surface of the protection top plate from the upper surface of the turntable varies along the circumferential direction.

14. The film deposition apparatus as claimed in claim 1, wherein the first lower surface portion, the third lower surface portion, and the second lower surface portion are successively arranged along the circumferential direction of the turntable, so that the first space is adjacent to the third space along the circumferential direction, and the third space is adjacent to the second space along the circumferential direction.

15. The film deposition apparatus as claimed in claim 13, wherein the first lower surface portion, the second lower surface portion, and the third lower surface portion are successively arranged along the circumferential direction of the turntable, so that the first space is adjacent to the third space along the circumferential direction, and the third space is adjacent to the second space along the circumferential direction.

* * * * *